US011978697B2

(12) United States Patent
Liao

(10) Patent No.: US 11,978,697 B2
(45) Date of Patent: May 7, 2024

(54) PACKAGE STRUCTURE

(71) Applicant: Taiwan Semiconductor Manufacturing Company, Ltd., Hsinchu (TW)

(72) Inventor: Wen-Shiang Liao, Miaoli County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 198 days.

(21) Appl. No.: 17/575,654

(22) Filed: Jan. 14, 2022

(65) Prior Publication Data

US 2023/0015634 A1 Jan. 19, 2023

Related U.S. Application Data

(60) Provisional application No. 63/222,423, filed on Jul. 16, 2021.

(51) Int. Cl.
*H01L 23/498* (2006.01)
*H01L 23/31* (2006.01)
*H01L 23/58* (2006.01)
*H01Q 1/22* (2006.01)
*H01Q 9/04* (2006.01)

(52) U.S. Cl.
CPC .... *H01L 23/49822* (2013.01); *H01L 23/3107* (2013.01); *H01L 23/585* (2013.01); *H01Q 1/2283* (2013.01); *H01Q 9/0414* (2013.01)

(58) Field of Classification Search
CPC .......... H01L 23/49822; H01L 23/3107; H01L 23/585
See application file for complete search history.

(56) References Cited

U.S. PATENT DOCUMENTS

| | | | |
|---|---|---|---|
| 9,000,584 B2 | 4/2015 | Lin et al. | |
| 9,048,222 B2 * | 6/2015 | Hung | H01L 23/5384 |
| 9,048,233 B2 | 6/2015 | Wu et al. | |
| 9,064,879 B2 * | 6/2015 | Hung | H01L 24/96 |
| 9,111,949 B2 | 8/2015 | Yu et al. | |
| 9,263,511 B2 | 2/2016 | Yu et al. | |
| 9,281,254 B2 * | 3/2016 | Yu | H01L 24/97 |
| 9,368,460 B2 * | 6/2016 | Yu | H01L 23/5389 |
| 9,372,206 B2 | 6/2016 | Wu et al. | |
| 9,496,189 B2 * | 11/2016 | Yu | H01L 22/20 |
| 2013/0062760 A1 * | 3/2013 | Hung | H01L 23/5389 257/738 |

(Continued)

*Primary Examiner* — Nathan W Ha
(74) *Attorney, Agent, or Firm* — JCIPRNET

(57) ABSTRACT

A package structure including a first radio frequency die, a second radio frequency die, an insulating encapsulant, a redistribution circuit structure, a first oscillation cavity and a second oscillation cavity is provided. A first frequency range of the first radio frequency die is different from a second frequency range of the second radio frequency die. The insulating encapsulant laterally encapsulates the first radio frequency die and the second radio frequency die. The redistribution circuit structure is disposed on the first radio frequency die, the second die and the insulating encapsulant. The first oscillation cavity is electrically connected to the first radio frequency die, and the second oscillation cavity is electrically connected to the second radio frequency die.

20 Claims, 20 Drawing Sheets

(56) References Cited

U.S. PATENT DOCUMENTS

| | | | | |
|---|---|---|---|---|
| 2015/0162316 A1* | 6/2015 | Yu | ............................ | H01L 24/17 |
| | | | | 257/773 |
| 2015/0364386 A1* | 12/2015 | Yu | ............................ | H01L 22/32 |
| | | | | 438/15 |
| 2016/0190096 A1* | 6/2016 | Yu | ........................ | H01L 23/3675 |
| | | | | 257/737 |
| 2018/0138147 A1* | 5/2018 | Yu | ............................ | H01L 23/528 |
| 2020/0235462 A1* | 7/2020 | Tsai | ..................... | H01L 21/4853 |
| 2021/0193589 A1* | 6/2021 | Pei | ........................ | H01L 23/5389 |
| 2021/0202562 A1* | 7/2021 | Chang | ..................... | H01L 21/56 |
| 2021/0366838 A1* | 11/2021 | Han | ................. | H01L 23/49838 |
| 2021/0407927 A1* | 12/2021 | Salmon | .................... | H01L 23/14 |
| 2022/0005787 A1* | 1/2022 | Han | ................. | H01L 23/49822 |
| 2022/0045008 A1* | 2/2022 | Kang | .................... | H01L 23/147 |
| 2022/0059427 A1* | 2/2022 | Kondo | .................... | H05K 1/181 |
| 2022/0189861 A1* | 6/2022 | Aleksov | ................ | H01L 23/562 |
| 2022/0199423 A1* | 6/2022 | Kim | ...................... | H01L 23/544 |
| 2022/0199546 A1* | 6/2022 | Elsherbini | ......... | H01L 23/49822 |
| 2022/0223529 A1* | 7/2022 | Buot | .................... | H01L 21/4857 |
| 2022/0246580 A1* | 8/2022 | Chava | ............... | H01L 23/49822 |
| 2022/0301970 A1* | 9/2022 | Kao | ......................... | H01L 24/73 |
| 2022/0320019 A1* | 10/2022 | Chang | .................. | H01L 23/145 |
| 2022/0359420 A1* | 11/2022 | Kim | ........................ | H01L 25/16 |
| 2022/0392855 A1* | 12/2022 | Darmawikarta | ......... | H01G 4/33 |
| 2023/0014567 A1* | 1/2023 | Yeon | .................... | H01Q 1/2283 |

* cited by examiner

PACKAGE STRUCTURE

This application claims the priority benefit of U.S. provisional applications Ser. No. 63/222,423, filed on Jul. 16, 2021. The entirety of the above-mentioned patent application is hereby incorporated by reference herein and made a part of this specification.

BACKGROUND

The semiconductor industry has experienced rapid growth due to continuous improvement in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed, and greater bandwidth, as well as lower power consumption and latency has grown recently, there has grown a need for smaller and more creative packaging techniques for semiconductor dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
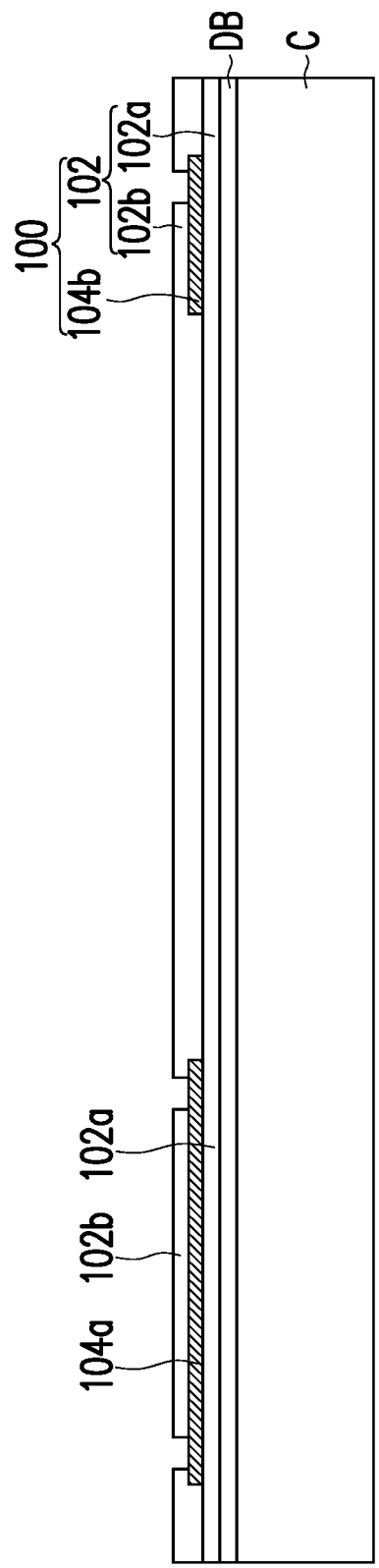
FIG. 1 through FIG. 7 are cross-sectional views schematically illustrating a process flow for fabricating an integrated fanout (InFO) package structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Embodiments of the disclosure may relate to (fin-type field-effect transistor) FinFET structure having fins. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIG. 1 through FIG. 7 are cross-sectional views schematically illustrating a process flow for fabricating an integrated fanout (InFO) package structure in accordance with some embodiments of the present disclosure.

Referring to FIG. 1, a carrier C including a de-bonding layer DB formed thereon is provided. In some embodiments, the carrier C is a glass substrate, a ceramic carrier, or the like. The carrier C may have a round top-view shape and a size of a common silicon wafer. For example, carrier C may have an 8-inch diameter, a 12-inch diameter, or the like. The de-bonding layer DB may be formed of a polymer-based material (e.g., a Light To Heat Conversion (LTHC) material), which may be removed along with the carrier C from the overlying structures that will be formed in subsequent steps. In some embodiments, the de-bonding layer DB is formed of an epoxy-based thermal-release material. In other embodiments, the de-bonding layer DB is formed of an ultra-violet (UV) glue. The de-bonding layer DB may be dispensed as a liquid and cured. In alternative embodiments, the de-bonding layer DB is a laminate film and is laminated onto the carrier C. The top surface of the de-bonding layer DB is substantially planar.

As illustrated in FIG. 1, a back side redistribution circuit structure 100 including dielectric layers 102 and redistribution wirings 104a and 104b sandwiched between the dielectric layers 102. The dielectric layers 102 of the back side redistribution circuit structure 100 may include a bottom dielectric layer 102a and a top dielectric layer 102b covering the bottom dielectric layer 102a and the redistribution wirings 104a and 104b. In some embodiments, the bottom dielectric layer 102a is formed of polymer, which may also be photo-sensitive material such as polybenzoxazole (PBO), polyimide, benzocyclobutene (BCB), or the like, which may be easily patterned using a photolithography process. In alternative embodiments, the bottom dielectric layer 102a is formed of nitride such as silicon nitride, oxide such as silicon oxide, PhosphoSilicate Glass (PSG), BoroSilicate Glass (BSG), Boron-doped PhosphoSilicate Glass (BPSG), or the like. The formation of the redistribution wirings 104a and 104b may include forming a seed layer (not shown) over a bottom dielectric layer 102a, forming a patterned mask (not shown) such as a photoresist layer over the seed layer, and then performing a plating process on the exposed seed layer. The patterned mask and the portions of the seed layer covered by the patterned mask are then removed, leaving the redistribution wirings 104a and 104b as shown in FIG. 1. In accordance with some embodiments, the seed layer includes a titanium layer and a copper layer over the titanium layer. The seed layer may be formed using, for example, Physical Vapor Deposition (PVD). The plating may be performed using, for example, electroless plating. As shown in FIG. 1, the top dielectric layer 102b among the dielectric layers 102 is formed over the bottom dielectric layer 102a to cover the redistribution wirings 104a and 104b. The bottom surface of the top dielectric layer 102b is in contact with the top surfaces of the redistribution wirings 104a and 104b and the bottom dielectric layer 102a. In accordance with some embodiments of the present disclosure, the top dielectric layer 102b is formed of a polymer, which may be a photo-sensitive material such as PBO, polyimide, BCB, or the like. In some alternative embodiments, the top dielectric layer 102b is formed of nitride such as silicon nitride, oxide such as silicon oxide, PSG, BSG, BPSG, or the like. The top dielectric layer 102b is then patterned to form openings therein through a photolithography process, a photolithography process followed by an etch process or other suitable patterning process. Hence, portions of the redistribution wirings 104a and 104b are exposed through the openings formed in the top dielectric layer 102b.

Figure 2:
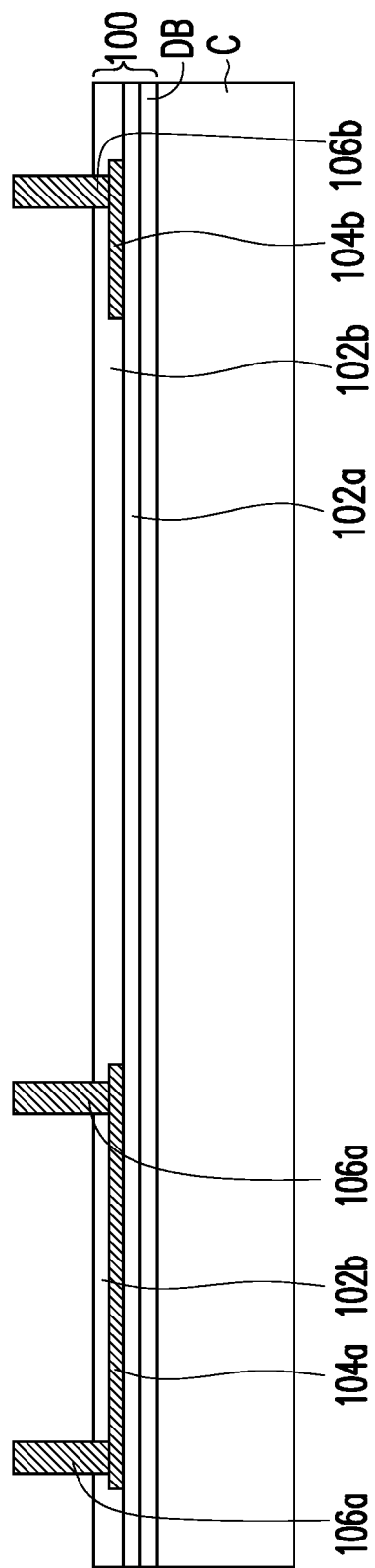

Referring to FIG. 2, after forming the back side redistribution circuit structure 100 over the de-bonding layer DB carried by the carrier C, metal posts 106a and 106b are formed on the back side redistribution circuit structure 100 and electrically connected to the redistribution wirings 104a and 104b of the back side redistribution circuit structure 100, respectively. The metal posts 106a and 106b protrude from the top surface of the top dielectric layer 102b. The metal posts 106a and 106b are formed to respectively land on portions of the redistribution wirings 104a and 104b which are exposed by the openings formed in the top dielectric layer 102b. Throughout the description, the metal posts 106a and 106b are alternatively referred to as conductive through-vias 106a and 106b since the metal posts 106a and 106b penetrate through the subsequently formed molding material (shown in FIG. 4). In some embodiments, the conductive through-vias 106a and 106b are formed by plating. The plating of the conductive through-vias 106a and 106b may include forming a blanket seed layer (not shown) over the top dielectric layer 102b and extending into the openings defined in the top dielectric layer 102b, forming and patterning a photoresist (not shown), and plating the conductive through-vias 106a and 106b on the portions of the seed layer that are exposed through the openings in the photoresist. The photoresist and the portions of the seed layer that are covered by the photoresist are then removed. The material of the conductive through-vias 106a and 106b may include copper, aluminum, or the like. The conductive through-vias 106a and 106b may have the shape of rods. The top-view shapes of the conductive through-vias 106a and 106b may be circles, rectangles, squares, hexagons, or the like.

Figure 3:
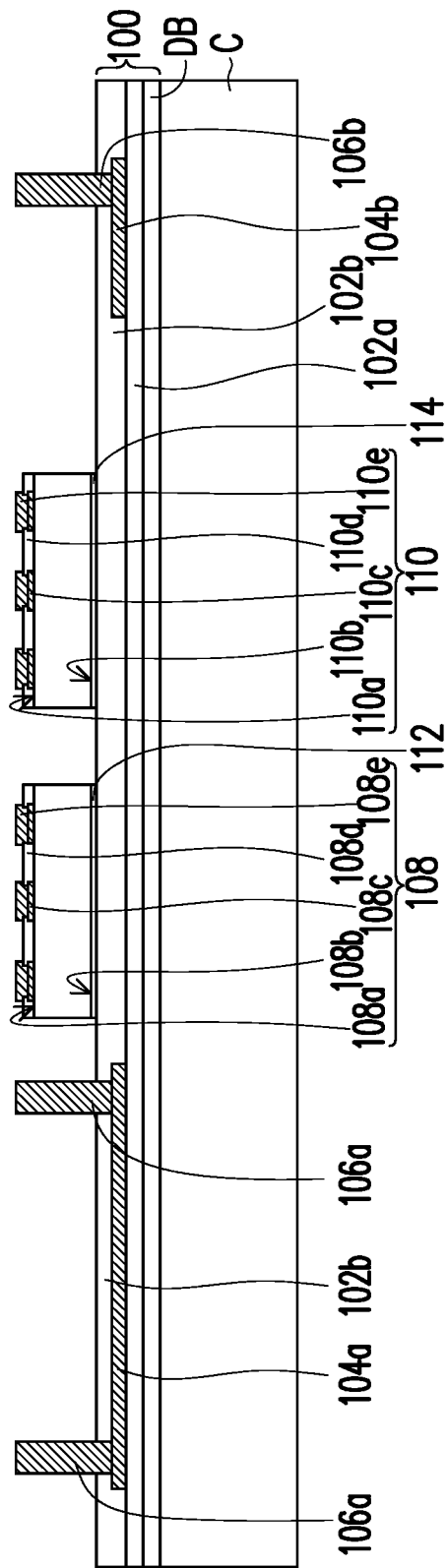

Referring to FIG. 3, a first radio frequency die 108 and a second radio frequency die 110 are picked and placed on the top dielectric layer 102b. In some embodiments, the first radio frequency die 108 and the second radio frequency die 110 are picked and placed on the top dielectric layer 102b in a side-by-side manner. The frequency range of the first radio frequency die 108 is different from the frequency range of the second radio frequency die 110. In some embodiments, the frequency range of the first radio frequency die 108 is smaller than the frequency range of the second radio frequency die 110. The frequency range of the first radio frequency die 108 may range from about 5.5 GHz to about 5.8 GHz, and the frequency range of the second radio frequency die 110 may be about 12.4 GHz. In other words, the first radio frequency die 108 may process a lower-frequency RF signal (e.g., RF signal with lower bandwidth of about 5.5 GHz to about 5.8 GHz), and the second radio frequency die 110 may process a higher-frequency RF signal (e.g. RF signal with higher bandwidth of about 12.4 GHz).

The first radio frequency die 108 may include a front surface 108a and a back surface 108b opposite to the front surface 108a. The first radio frequency die 108 may further include conductive pads 108c distributed on the front surface 108a, a passivation layer 108d, and conductive pillars 108e. The passivation layer 108d covers the conductive pads 108c and the front surface 108a. The passivation layer 108d includes openings for exposing the conductive pads 108a. The conductive pillars 108e are disposed on the passivation layer 108d and electrically connected to the conductive pads 108c through the openings formed in the passivation layer 108d. In some embodiments, the conductive pillars 108e protrude from the top surface of the passivation layer 108d. Furthermore, the back surface 108b of the first radio frequency die 108 may be attached to a die-bond region of the top dielectric layer 102b through a die attach film (DAF) 112, an adhesive or the like.

The second radio frequency die 110 may include a front surface 110a and a back surface 110b opposite to the front surface 110a. The first radio frequency die 110 may further include conductive pads 110c distributed on the front surface 110a, a passivation layer 110d, and conductive pillars 110e. The passivation layer 110d covers the conductive pads 110c and the front surface 110a. The passivation layer 110d includes openings for exposing the conductive pads 110a. The conductive pillars 110e are disposed on the passivation layer 110d and electrically connected to the conductive pads 110c through the openings formed in the passivation layer 110d. In some embodiments, the conductive pillars 110e protrude from the top surface of the passivation layer 110d. Furthermore, the back surface 110b of the second radio frequency die 110 may be attached to another die-bond region of the top dielectric layer 102b through a die attach film 114, an adhesive or the like.

As illustrated in FIG. 3, the level height of the top surfaces of the conductive pillars 108e is substantially level with the level height of the top surfaces of the conductive pillars 110e; the level height of the top surfaces of the conductive pillars 108e and 110e is lower than the level height of the top surfaces of the conductive through vias 106a and 106b; the level height of the top surface of the passivation layer 108d is substantially level with the level height of the top surface of the passivation layer 110d; and the level height of the top surfaces of the passivation layers 108d and 110d is lower than the level height of the top surfaces of the conductive pillars 108e and 110e.

However, the arrangement of the passivation layers 108d and 110d as well as the conductive pillars 108e and 110e is not limited in the present disclosure. The conductive pillars 108e may be encapsulated by the passivation layer 108d, and the conductive pillars 110e may be encapsulated by the passivation layer 110d. The conductive pillars 108e may not protrude from the passivation layer 108d, and the conductive pillars 110e may not protrude from the passivation layer 110d. In other words, the level height of the top surfaces of the passivation layers 108d and 110d is lower than the level height of the top surfaces of the conductive through vias 106a and 106b, and the level height of the top surfaces of the passivation layers 108d and 110d is higher than the level height of the top surfaces of the conductive pillars 108e and 110e.

Figure 4:
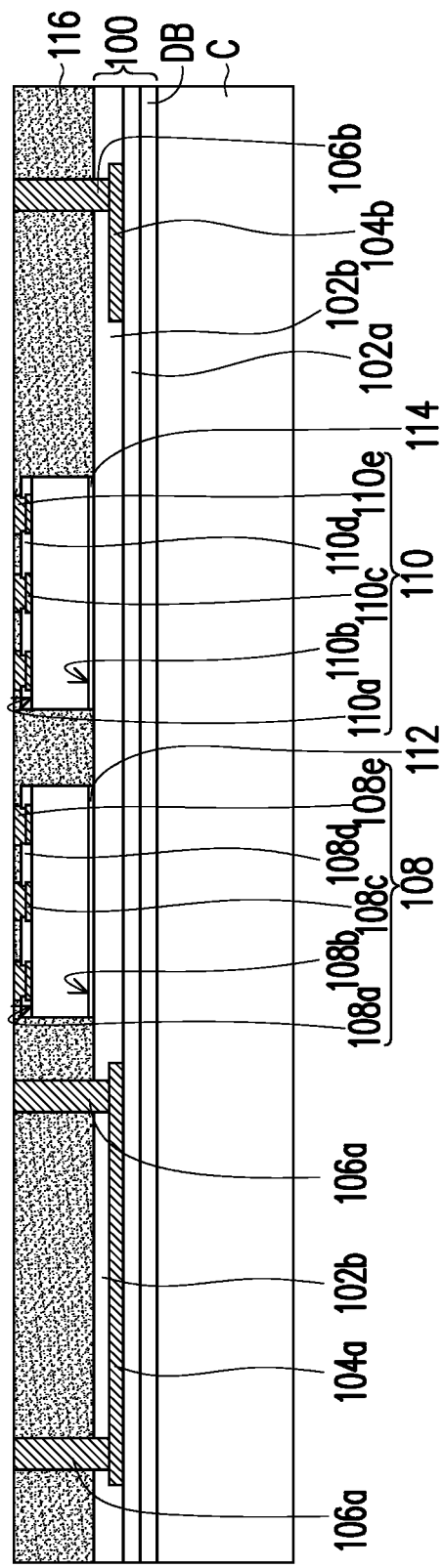

Referring to FIG. 4, an insulating material is formed on the top dielectric layer 102b to cover the first radio frequency die 108, the second radio frequency die 110 and the conductive through vias 106a and 106b. The passivation layer 108d, the passivation layer 110d, the conductive pillars 108e and the conductive pillars 110e may be covered by the insulating material. The insulating material may be in contact with the first radio frequency die 108, the second radio frequency die 110 and the conductive through-vias 106a and 106b directly. The top surface of the insulating material may be higher than the top surfaces of the first radio frequency die 108, the second radio frequency die 110 and the top surfaces of the conductive through-vias 106a and 106b. The insulating material may be a molding compound formed by a molding process. In some embodiments, the insulating material includes epoxy or other suitable dielectric materials.

The insulating material is partially removed until the top surfaces of the conductive pillars 108e and 110e and the top surfaces of the conductive through vias 106a and 106b are exposed. In some embodiments, the insulating material is partially removed through a mechanical grinding process and/or a chemical mechanical polishing (CMP) process. After the insulating material is partially removed, an insulating encapsulation 116 is formed over the top dielectric layer 102b to laterally encapsulate the first radio frequency die 108, the second radio frequency die 110 and the conductive through-vias 106a and 106b. During the removal process of the insulating material, portions of the conductive through vias 106a and 106b as well as portions of the conductive pillars 108e and 110e are partially removed.

After forming the insulating encapsulation 116, the top surface of the insulating encapsulation 116 is substantially level with the top surfaces of the conductive through vias 106a and 106b as well as the top surfaces of the conductive pillars 108e and 110e. The top surfaces of the conductive through vias 106a, the top surfaces of the conductive through vias 106b, the top surfaces of the conductive pillars 108e and the top surfaces of the conductive through vias 110e are revealed. The insulating encapsulant 116 is in contact with sidewalls of the conductive pillars 108e and 110e. As illustrated in FIG. 4, the level height of the top surfaces of the passivation layers 108d and 110d is lower than the level height of the top surface of the insulating encapsulation 116. Furthermore, the top surfaces of the passivation layers 108d and 110d are covered by the insulating encapsulation 116.

In some other embodiments, not illustrated in figures, after forming the insulating encapsulation 116, the top surface of the insulating encapsulation 116 is substantially level with the top surface of the passivation layer 108d, the top surface of the passivation layer 110d, the top surfaces of the conductive through vias 106a, the top surfaces of the conductive through vias 106b, the top surfaces of the conductive pillars 108e and the top surfaces of the conductive pillars 110e. Furthermore, the insulating encapsulant 116 is not in contact with sidewalls of the conductive pillars 108e and 110e. In other words, the insulating encapsulant 116 is spaced apart from the conductive pillars 108e by the passivation layer 108d, and the insulating encapsulant 116 is spaced apart from the conductive pillars 110e by the passivation layer 110d.

Figure 5:
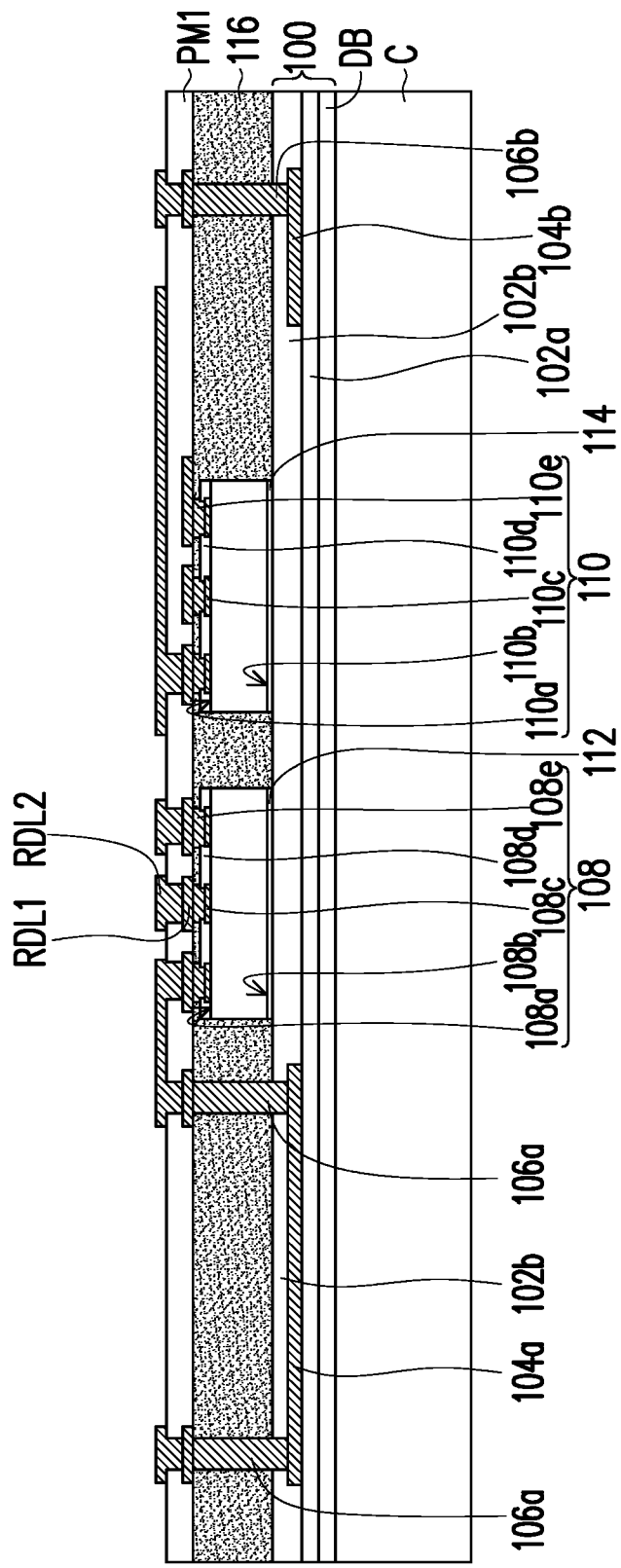
Figure 6:
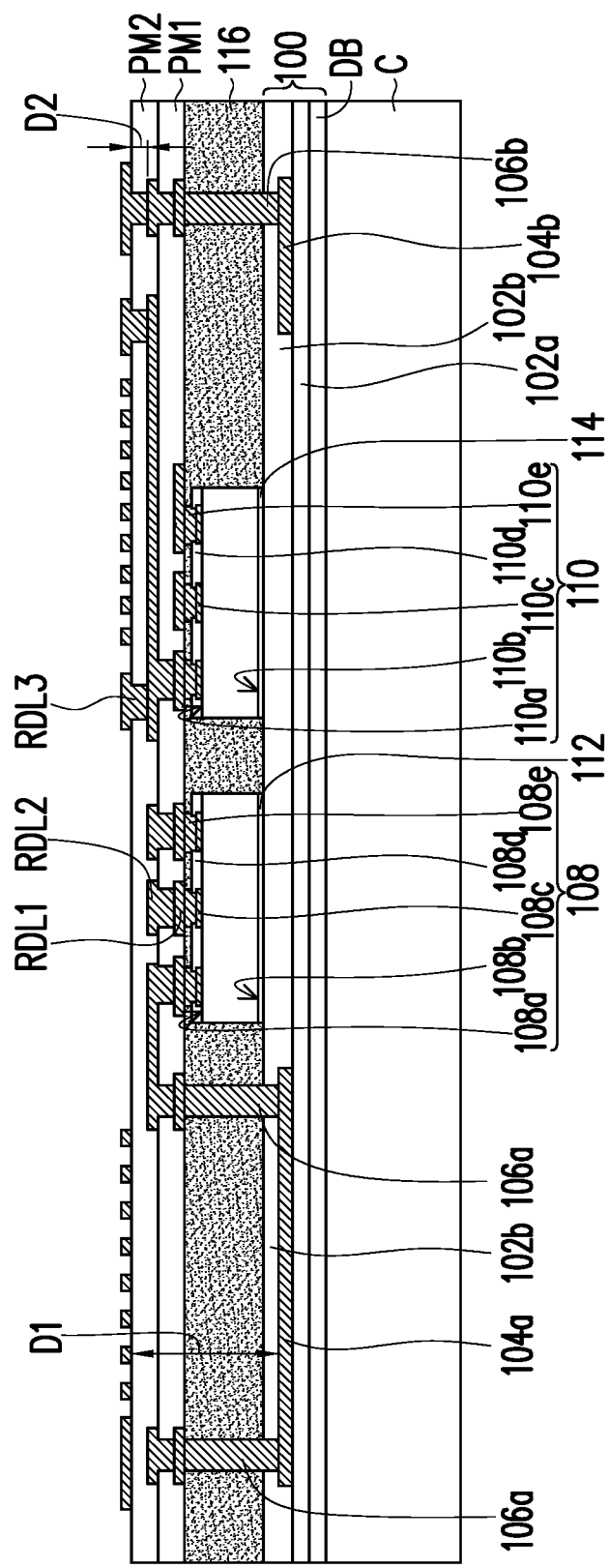
Figure 7:
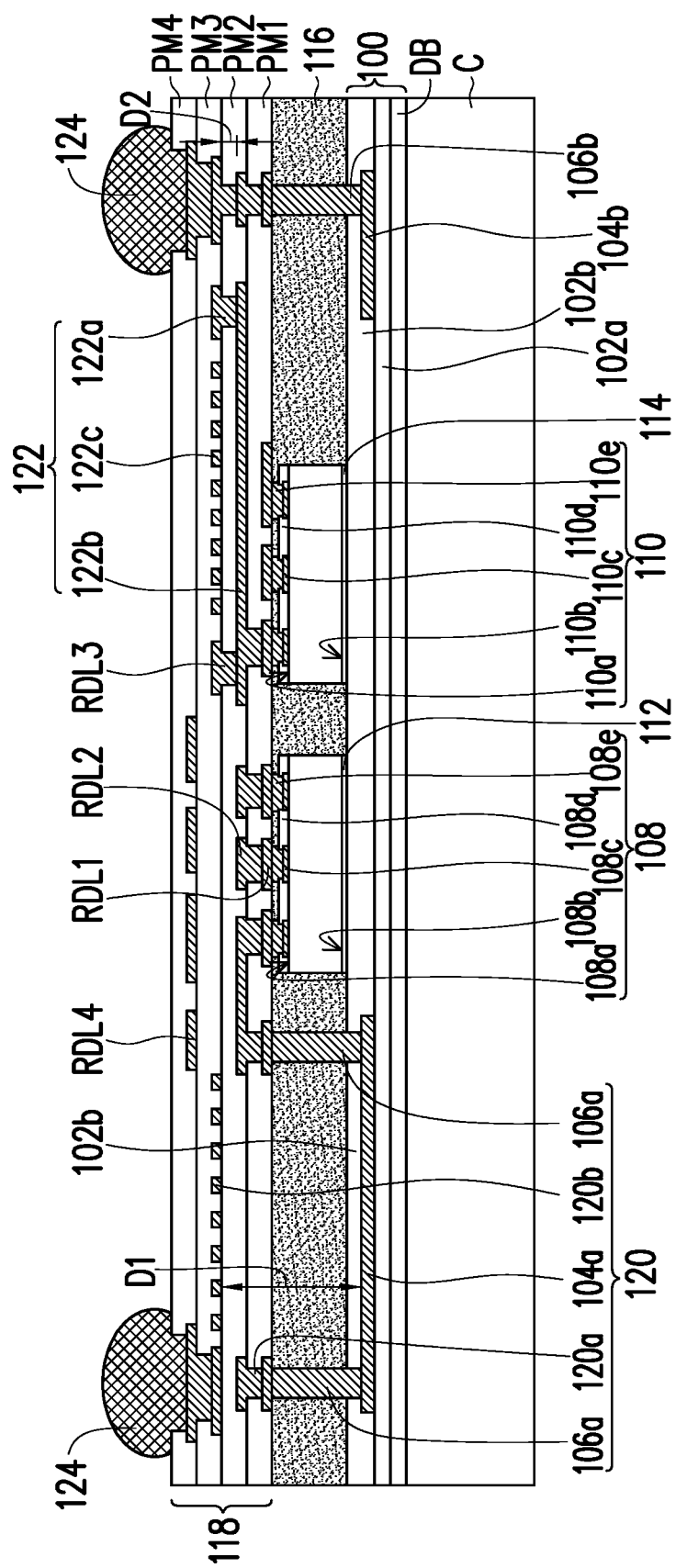

Referring to FIG. 5 through FIG. 7, after forming the insulating encapsulation 116, a front side redistribution circuit structure 118 (shown in FIG. 7) is formed on the top surface of the insulating encapsulation 116. The front side redistribution circuit structure 118 is fabricated to electrically connect with one or more connectors underneath. Here, the afore-said connectors may be or include the conductive pillars 108e of the first radio frequency die 108, the conductive pillars 110e of the second radio frequency die 110, the conductive through-vias 106a and the conductive through-vias 106b. The fabrication processes of the front side redistribution circuit structure 118 are described in accompany with FIG. 5 through FIG. 7 in detail.

As illustrated in FIG. 5, redistribution wirings RDL1 are formed on the top surface of the insulating encapsulation 116. The redistribution wirings RDL1 are electrically connected to the conductive pillars 108e of the first radio frequency die 108, the conductive pillars 110e of the second radio frequency die 110, the conductive through-vias 106a and the conductive through-vias 106b. The formation of the redistribution wirings RDL1 may include forming a seed layer (not shown) over the insulating encapsulant 116, forming a patterned mask (not shown) such as a photoresist layer over the seed layer, and then performing a plating process on the exposed seed layer. The patterned mask and the portions of the seed layer covered by the patterned mask are then removed, leaving the redistribution wirings RDL1 as shown in FIG. 5. In accordance with some embodiments, the seed layer includes a titanium layer and a copper layer over the titanium layer. The seed layer may be formed using, for example, PVD. The plating may be performed using, for example, electroless plating. The material of the redistribution wirings RDL1 may include copper, aluminum, alloy thereof, or the like.

A dielectric layer PM1 is formed on the top surface of the insulating encapsulation 116 to cover the redistribution wirings RDL1. In some embodiments, the dielectric layer PM1 is formed of a polymer, which may be a photo-sensitive material such as PBO, polyimide, BCB, or the like. In some alternative embodiments, the dielectric layer PM1 is formed of nitride such as silicon nitride, oxide such as silicon oxide, PSG, BSG, BPSG, or the like. In an embodiment where the dielectric layer PM1 includes a photo-sensitive material such as PBO, polyimide, BCB, or the like, the dielectric layer PM1 is patterned to form openings therein through a photolithography process. In an embodiment where the dielectric layer PM1 includes silicon oxide, PSG, BSG, BPSG, or the like, the dielectric layer PM1 is patterned to form openings therein through a photolithography process followed by an etch process. Hence, portions of the redistribution wirings RDL1 are exposed through the openings formed in the dielectric layer PM1.

Redistribution wirings RDL2 are then formed on the top surface of the dielectric layer PM1. The redistribution wirings RDL2 are electrically connected to the redistribution wirings RDL1 through the openings formed in the dielectric layer PM1. The formation of the redistribution wirings RDL2 may include forming a seed layer (not shown) over the dielectric layer PM1, forming a patterned mask (not shown) such as a photoresist layer over the seed layer, and then performing a plating process on the exposed seed layer. The patterned mask and the portions of the seed layer covered by the patterned mask are then removed, leaving the redistribution wirings RDL2 as shown in FIG. 5. In accordance with some embodiments, the seed layer includes a titanium layer and a copper layer over the titanium layer. The seed layer may be formed using, for example, PVD. The plating may be performed using, for example, electroless plating. The material of the redistribution wirings RDL2 may include copper, aluminum, alloy thereof, or the like.

Referring to FIG. 6, a dielectric layer PM2 is formed on the top surface of the dielectric layer PM1 to cover the redistribution wirings RDL2. In some embodiments, the dielectric layer PM2 is formed of a polymer, which may be a photo-sensitive material such as PBO, polyimide, BCB, or the like. In some alternative embodiments, the dielectric layer PM2 is formed of nitride such as silicon nitride, oxide such as silicon oxide, PSG, BSG, BPSG, or the like. In an embodiment where the dielectric layer PM2 includes a photo-sensitive material such as PBO, polyimide, BCB, or the like, the dielectric layer PM2 is patterned to form openings therein through a photolithography process. In an embodiment where the dielectric layer PM2 includes silicon oxide, PSG, BSG, BPSG, or the like, the dielectric layer PM2 is patterned to form openings therein through a photolithography process followed by an etch process. Hence, portions of the redistribution wirings RDL2 are exposed through the openings formed in the dielectric layer PM2.

Redistribution wirings RDL3 are then formed on the top surface of the dielectric layer PM2. The redistribution wirings RDL3 are electrically connected to the redistribution wirings RDL2 through the openings formed in the dielectric layer PM2. The formation of the redistribution wirings RDL3 may include forming a seed layer (not shown) over the dielectric layer PM2, forming a patterned mask (not shown) such as a photoresist layer over the seed layer, and then performing a plating process on the exposed seed layer. The patterned mask and the portions of the seed layer covered by the patterned mask are then removed, leaving the redistribution wirings RDL3 as shown in FIG. 6. In accordance with some embodiments, the seed layer includes a titanium layer and a copper layer over the titanium layer. The seed layer may be formed using, for example, PVD. The plating may be performed using, for example, electroless plating. The material of the redistribution wirings RDL3 may include copper, aluminum, alloy thereof, or the like.

As illustrated in FIG. 6, after forming the redistribution wirings RDL3, a first oscillation cavity 120 electrically connected to the first radio frequency die 108 and a second oscillation cavity 122 electrically connected to the second radio frequency die 110 are formed. In some embodiments, the first oscillation cavity 120 is capable of transmitting the RF signal received from the first radio frequency die 108, the second oscillation cavity 122 is capable of transmitting the RF signal received from the second radio frequency die 110. The bandwidth of the RF signal from the first radio frequency die 108 may range from about 5.5 GHz to about 5.8 GHz, and the bandwidth of the RF signal from the second radio frequency die 110 may be about 12.4 GHz. In other words, the first oscillation cavity 120 may transmit a lower-frequency RF signal (e.g., RF signal with lower bandwidth of about 5.5 GHz to about 5.8 GHz), and the second first oscillation cavity 122 may transmit a higher-frequency RF signal (e.g. RF signal with higher bandwidth of about 12.4 GHz).

The first oscillation cavity 120 is embedded in the back side redistribution circuit structure 100, the insulating encapsulant 116 and the front side redistribution circuit structure 118. The second oscillation cavity 122 is embedded in the front side redistribution circuit structure 118. The second oscillation cavity 122 is located at a side of the insulating encapsulant 116. The first oscillation cavity 120 may include a patch antenna, and the patch antenna may include first conductive through-vias 106a embedded in the insulating encapsulant 116, conductive vias 120a penetrating through the dielectric layer PM1, a first electrode 104a and first conductive grids 120b, wherein the first electrode 104a and the first conductive grids 120b are disposed at opposite sides of the insulating encapsulant 116. The conductive vias 120a, the first conductive through-vias 106a and the first electrode 104a are electrically connected to the first radio frequency die 108 through the redistribution wirings RDL1 and RDL2, and the first conductive grids 120b are electrically grounded. The conductive vias 120a are conductive portions of the redistribution wirings RDL2. The first conductive grids 120b are conductive portions of the redistribution wirings RDL3. The second oscillation cavity 122 may include a patch antenna, and the patch antenna may include second conductive posts 122a, a second electrode 122b and second conductive grids 122c, wherein the second conductive posts 122a and the second electrode 122b are electrically connected to the second radio frequency die 110 through the redistribution wirings RDL1, the second electrode 122b and the second conductive grids 122c are disposed at the same side (e.g., an upper side) of the insulating encapsulant 116, and the second conductive grids 122c are electrically grounded. The second conductive posts 122a and the second conductive grids 122c are different conductive portions of the redistribution wirings RDL3. The second electrode 122b is a conductive portion of the redistribution wirings RDL2.

As illustrated in FIG. 6, the first electrode 104a of the first oscillation cavity 120 is located at a first level height, the second electrode 122b of the second oscillation cavity 122 is located at a second level height which is higher than the first level height, and the first conductive grids 120b of the first oscillation cavity 120 and the second conductive grids 122c of the second oscillation cavity 122 are located at a third level height which is higher than the first level height and the second level height. In some embodiments, a first level height difference D1 between the first electrode 104*a* and the first conductive grids 120*b* is greater than a level height difference D2 between the second electrode 122*b* and the second conductive grids 122*c*. In some embodiments, the first conductive grids 120*b* and the second conductive grids 122*c* are located at a same level height (i.e., the level height where the redistribution wirings RDL3 are located). In some embodiments, the first electrode 104*a* is spaced apart from the first conductive grids 120*b* by at least one dielectric layer (e.g., the dielectric layer 102*b*) of the back side redistribution circuit structure 100, the insulating encapsulant 116 and at least one dielectric layer (e.g., the dielectric layers PM1 and PM2) of the front side redistribution circuit structure 118. In some embodiments, the second electrode 122*b* is spaced apart from the second conductive grids 122*c* by at least one dielectric layer (e.g., the dielectric layer PM2) of the front side redistribution circuit structure 118. Furthermore, the second oscillation cavity 122 is stacked over the second radio frequency die 110.

Figure 8:
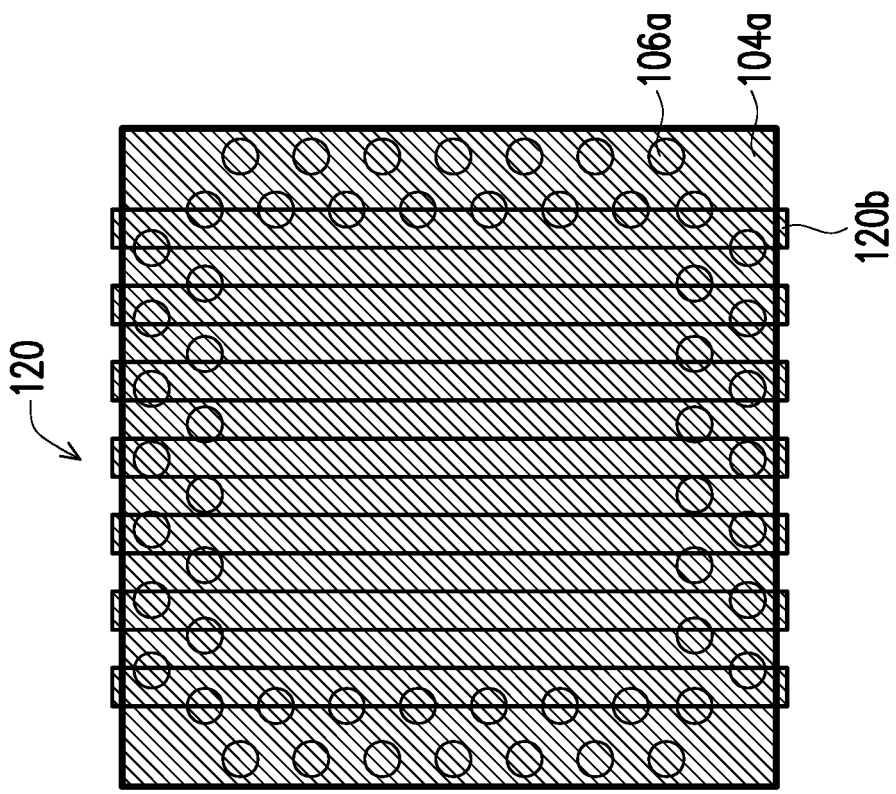
FIG. 8 is a top view schematically illustrating an electrode, conductive posts and conductive grids of a lower-frequency radio frequency (RF) die.

As illustrated in FIG. 8, a top view for schematically illustrating the first electrode 104*a*, the conductive through-vias 106*a* and the first conductive grids 120*b* of the first oscillation cavity 120 in a lower-frequency RF die is shown. The conductive through-vias 106*a* are arranged in a ring-shaped area and land on the first electrode 104*a*. The first conductive grids 120*b* are located above the first electrode 104*a*. The dimension (e.g., width) of the first electrode 104*a* may range from about 100 micrometers to about 10000 micrometers, and the thickness of the first electrode 104*a* may range from about 1 micrometer to about 20 micrometers. The dimension (e.g., width) of the conductive through-vias 106*a* may range from about 50 micrometers to about 500 micrometers, the spacing between neighboring conductive through-vias 106*a* may range from about 50 micrometers to about 500 micrometers, and the height of the conductive through-vias 106*a* may range from about 100 micrometers to about 500 micrometers. The dimension (e.g., width) of the first conductive grids 120*b* may substantially equal to the spacing between neighboring first conductive grids 120*b*. The dimension (e.g., width) of the first conductive grids 120*b* may range from about 0.01 micrometers to about 10 micrometers, the spacing between neighboring first conductive grids 120*b* may range from about 0.01 micrometers to about 10 micrometers, and the thickness of the first conductive grids 120*b* may range from about 1 micrometer to about 30 micrometers.

Figure 9:
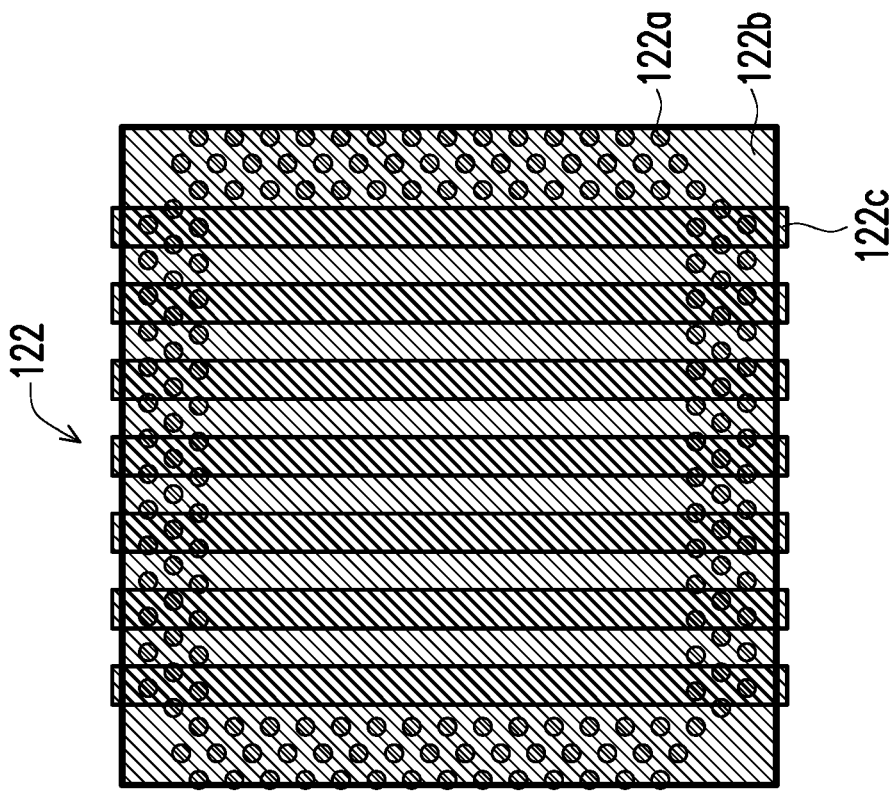
FIG. 9 is a top view schematically illustrating an electrode, conductive posts and conductive grids of a high-frequency RF die.

As illustrated in FIG. 9, a top view for schematically illustrating the second electrode 122*b*, the second conductive posts 122*a* and the second conductive grids 122*c* of the second oscillation cavity 122 in a high-frequency RF die is shown. The second conductive posts 122*a* are arranged in a ring-shaped area and land on the second electrode 122*b*. The second conductive grids 122*c* are located above the second electrode 122*b*. The dimension (e.g., width) of the second electrode 122*b* may range from about 100 micrometers to about 10000 micrometers, and the thickness of the second electrode 122*b* may range from about 1 micrometer to about 100 micrometers. The dimension (e.g., width) of the second conductive posts 122*a* may range from about 0.01 micrometers to about 10 micrometers, the spacing between neighboring second conductive posts 122*a* may range from about 0.01 micrometers to about 10 micrometers, and the height of the second conductive posts 122*a* may range from about 5 micrometers to about 50 micrometers. The dimension (e.g., width) of the first conductive grids 120*b* may substantially equal to the spacing between neighboring first conductive grids 120*b*. The dimension (e.g., width) of the second conductive grids 122*c* may range from about 0.01 micrometers to about 10 micrometers, the spacing between neighboring second conductive grids 122*c* may range from about 0.01 micrometers to about 10 micrometers, and the thickness of the second conductive grids 122*c* may range from about 1 micrometer to about 30 micrometers.

Referring to FIG. 7, a dielectric layer PM3 is formed on the top surface of the dielectric layer PM2 to cover the redistribution wirings RDL3. In some embodiments, the dielectric layer PM3 is formed of a polymer, which may be a photo-sensitive material such as PBO, polyimide, BCB, or the like. In some alternative embodiments, the dielectric layer PM3 is formed of nitride such as silicon nitride, oxide such as silicon oxide, PSG, BSG, BPSG, or the like. In an embodiment where the dielectric layer PM3 includes a photo-sensitive material such as PBO, polyimide, BCB, or the like, the dielectric layer PM3 is patterned to form openings therein through a photolithography process. In an embodiment where the dielectric layer PM3 includes silicon oxide, PSG, BSG, BPSG, or the like, the dielectric layer PM3 is patterned to form openings therein through a photolithography process followed by an etch process. Hence, portions of the redistribution wirings RDL3 are exposed through the openings formed in the dielectric layer PM3.

Redistribution wirings RDL4 are then formed on the top surface of the dielectric layer PM3. The redistribution wirings RDL4 are electrically connected to the redistribution wirings RDL3 through the openings formed in the dielectric layer PM3. The formation of the redistribution wirings RDL4 may include forming a seed layer (not shown) over the dielectric layer PM3, forming a patterned mask (not shown) such as a photoresist layer over the seed layer, and then performing a plating process on the exposed seed layer. The patterned mask and the portions of the seed layer covered by the patterned mask are then removed, leaving the redistribution wirings RDL4 as shown in FIG. 7. In accordance with some embodiments, the seed layer includes a titanium layer and a copper layer over the titanium layer. The seed layer may be formed using, for example, PVD. The plating may be performed using, for example, electroless plating. The material of the redistribution wirings RDL4 may include copper, aluminum, alloy thereof, or the like.

A dielectric layer PM4 is formed on the top surface of the dielectric layer PM3 to cover the redistribution wirings RDL4. In some embodiments, the dielectric layer PM4 is formed of a polymer, which may be a photo-sensitive material such as PBO, polyimide, BCB, or the like. In some alternative embodiments, the dielectric layer PM4 is formed of nitride such as silicon nitride, oxide such as silicon oxide, PSG, BSG, BPSG, or the like. In an embodiment where the dielectric layer PM4 includes a photo-sensitive material such as PBO, polyimide, BCB, or the like, the dielectric layer PM4 is patterned to form openings therein through a photolithography process. In an embodiment where the dielectric layer PM4 includes silicon oxide, PSG, BSG, BPSG, or the like, the dielectric layer PM4 is patterned to form openings therein through a photolithography process followed by an etch process. Hence, portions of the redistribution wirings RDL4 are exposed through the openings formed in the dielectric layer PM4.

As illustrated in FIG. 7, the front side redistribution circuit structure 118 includes the dielectric layer PM1, the dielectric layer PM2, the dielectric layer PM3, the dielectric layer PM4, the redistribution wirings RDL1, the redistribution wirings RDL2, the redistribution wirings RDL3 and the redistribution wirings RDL4. The redistribution wirings RDL1 are disposed on the top surface of the insulating encapsulant 116 and electrically connected to the first radio frequency die 108, the second radio frequency die 110 and the first conductive through-vias 106a and 106b. The dielectric layer PM1 covers the insulating encapsulant 116 and the redistribution wirings RDL1. The redistribution wirings RDL2 are disposed on the top surface of the dielectric layer PM1 and located between the dielectric layer PM1 and the dielectric layer PM2. The redistribution wirings RDL3 are disposed on the top surface of the dielectric layer PM2 and located between the dielectric layer PM2 and the dielectric layer PM3. The redistribution wirings RDL4 are disposed on the top surface of the dielectric layer PM3 and located between the dielectric layer PM3 and the dielectric layer PM4.

After forming the dielectric layer PM4 of the front side redistribution circuit structure 118, conductive terminals 124 are formed over the dielectric layer PM4 and portions of the redistribution wirings RDL4 exposed by the openings formed in the dielectric layer PM4. In some embodiments, the redistribution wirings RDL4 include under-ball metallurgy (UBM) patterns for ball mount and/or connection pads for mounting of passive components. Furthermore, the conductive terminals 124 include solder balls or other suitable metallic balls.

Throughout the description, the combined structure including the back side redistribution circuit structure 100, the first radio frequency die 108, the second radio frequency die 110, the insulating encapsulant 116, the front side redistribution circuit structure 118 and the conductive terminals 124 will be referred to as a package structure, which may be a composite wafer with a round top-view shape. A singulation process may be performed to singulate the combined structure illustrated in FIG. 7 into singulated package structures.

Figure 10:
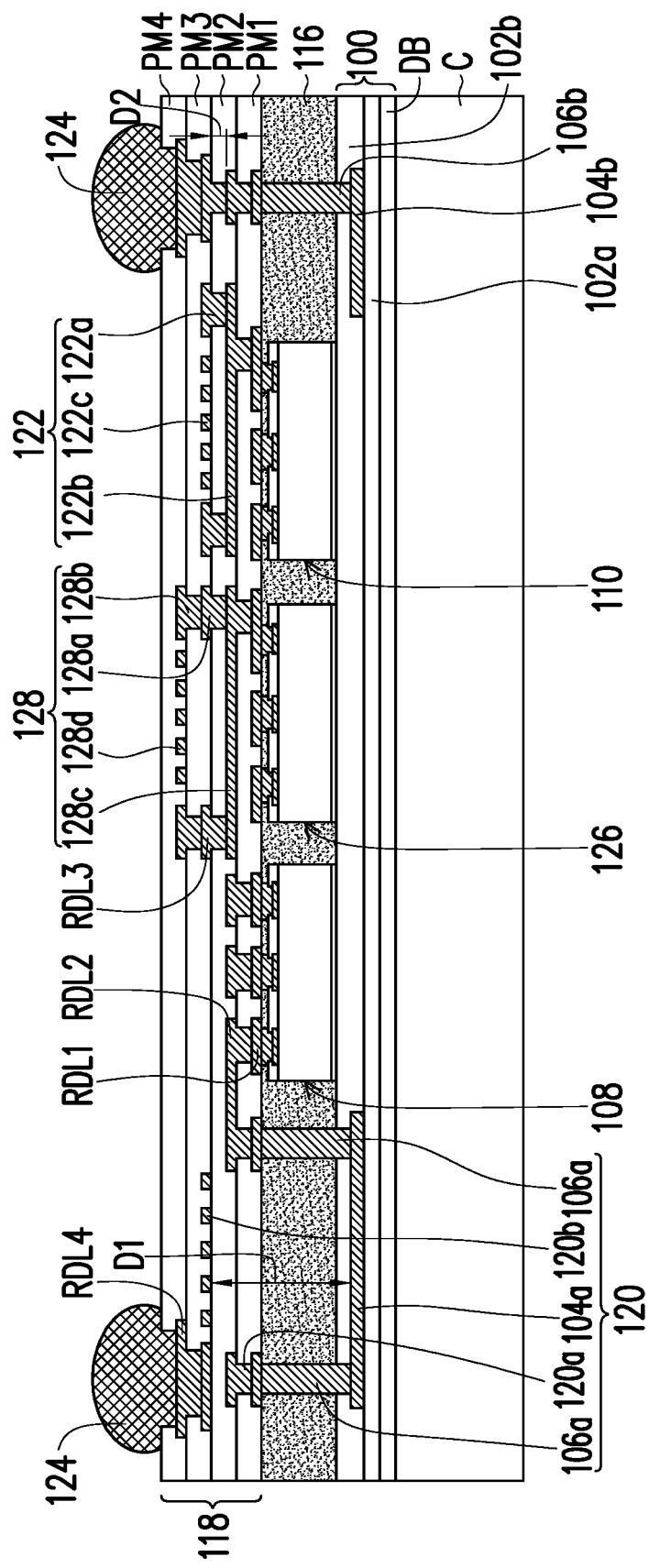
FIG. 10 and FIG. 11 are cross-sectional views schematically illustrating package structures in accordance with some alternative embodiments of the present disclosure.
Figure 11:
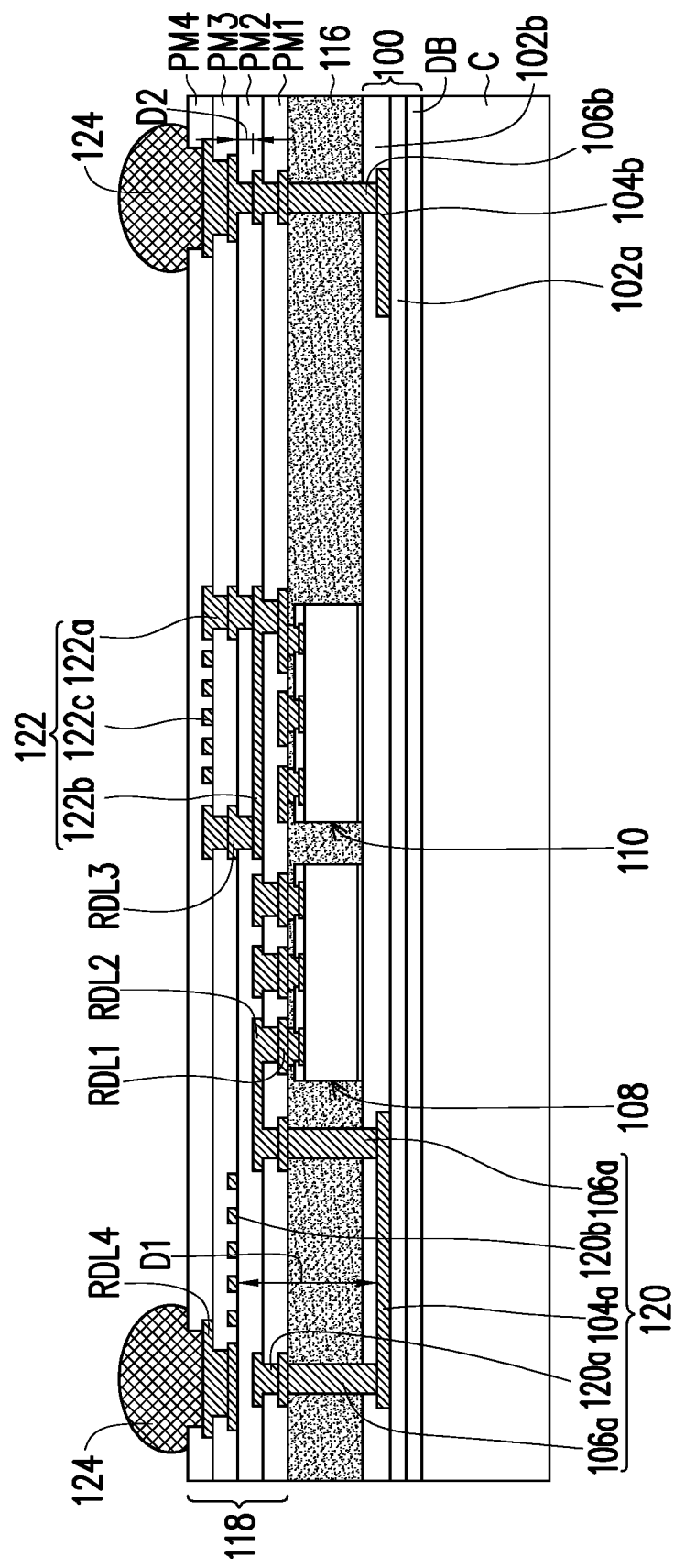

FIG. 10 and FIG. 11 are cross-sectional views schematically illustrating package structures in accordance with some alternative embodiments of the present disclosure.

Referring to FIG. 7 and FIG. 10, the package structure illustrated in FIG. 10 is similar to the package structure illustrated in FIG. 7 except that the package structure illustrated in FIG. 10 further includes a third radio frequency die 126 and a third oscillation cavity 128, wherein the frequency range of the third radio frequency die 126 is different from the frequency range of the first radio frequency die 108 and the frequency range of the second radio frequency die 110, and the third oscillation cavity 128 is electrically connected to the third radio frequency die 126. The package structure illustrated in FIG. 10 is a triple band module capable of processing triple band RF signal. As illustrated in FIG. 10, the third oscillation cavity 128 may include a patch antenna, and the patch antenna may include third conductive posts 128a and 128b, a third electrode 128c and third conductive grids 128d, wherein the third conductive posts 128a, 128b and the third electrode 128c are electrically connected to the third radio frequency die 126 through the redistribution wirings RDL1, the third electrode 128c and the third conductive grids 128d are disposed at the same side (e.g., an upper side) of the insulating encapsulant 116, and the third conductive grids 128d are electrically grounded. The third conductive posts 128a are conductive portions of the redistribution wirings RDL3. The third conductive posts 128b and the third conductive grids 128d are different conductive portions of the redistribution wirings RDL4. The third electrode 128c is a conductive portion of the redistribution wirings RDL2.

As illustrated in FIG. 10, the third electrode 128c of the third oscillation cavity 128 and the second electrode 122b of the second oscillation cavity 122 are located at the same level heigh. The third conductive grids 128d of the third oscillation cavity 128 are located at a level height higher than the level height of the second conductive grids 122c of the second oscillation cavity 122. In some embodiments, the third electrode 128c is spaced apart from conductive grids 128d by at least one dielectric layer (e.g., the dielectric layers PM2 and PM3) of the front side redistribution circuit structure 118. Furthermore, the third oscillation cavity 128 is stacked over the third radio frequency die 126.

Referring to FIG. 10 and FIG. 11, the package structure illustrated in FIG. 11 is similar to the package structure illustrated in FIG. 10 except that the package structure illustrated in FIG. 11 includes the first radio frequency die 108, the first oscillation cavity 120, the third radio frequency die 126 and the third oscillation cavity 128. The package structure illustrated in FIG. 11 is a dual band module capable of processing triple band RF signal. The package structure illustrated in FIG. 11 does not include the second radio frequency die 110 and the second oscillation cavity 122 shown in FIG. 10.

FIG. 12 through FIG. 18 are cross-sectional views schematically illustrating a process flow for fabricating an InFO package structure in accordance with another embodiment of the present disclosure.

Figure 12:
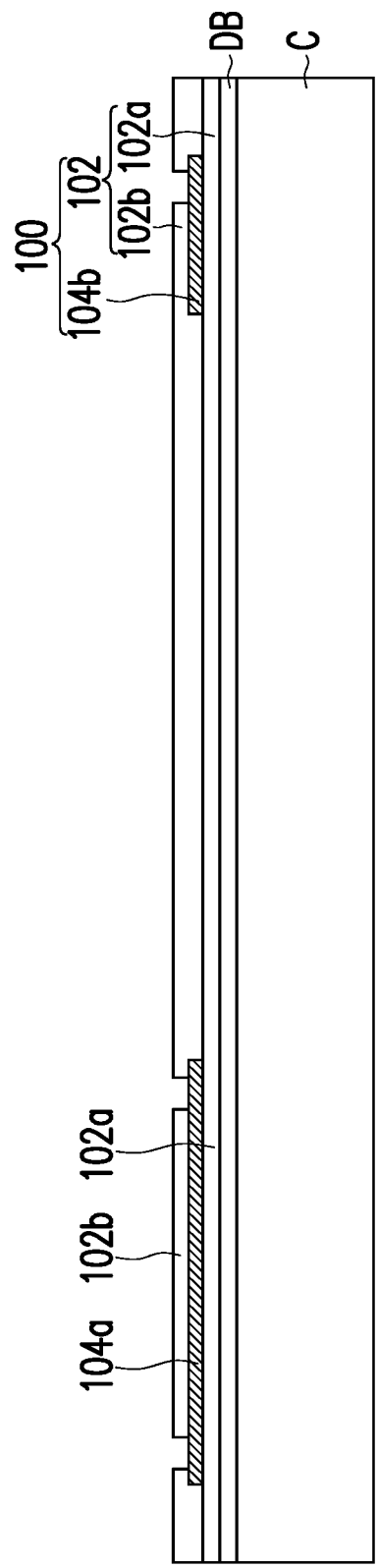
FIG. 12 through FIG. 18 are cross-sectional views schematically illustrating a process flow for fabricating an InFO package structure in accordance with another embodiment of the present disclosure.
Figure 13:
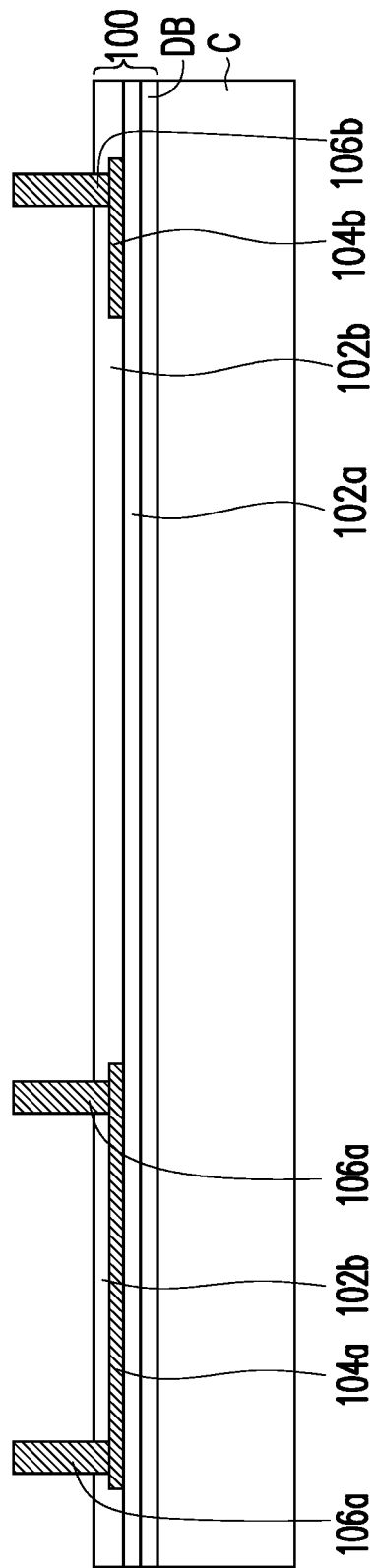

Referring to FIG. 12 and FIG. 13, since the processes illustrated in FIGS. 12 and 13 are the same as those illustrated in FIG. 1 and FIG. 2, detailed descriptions regarding to the processes illustrated in FIG. 12 and FIG. 13 are thus omitted.

Figure 14:
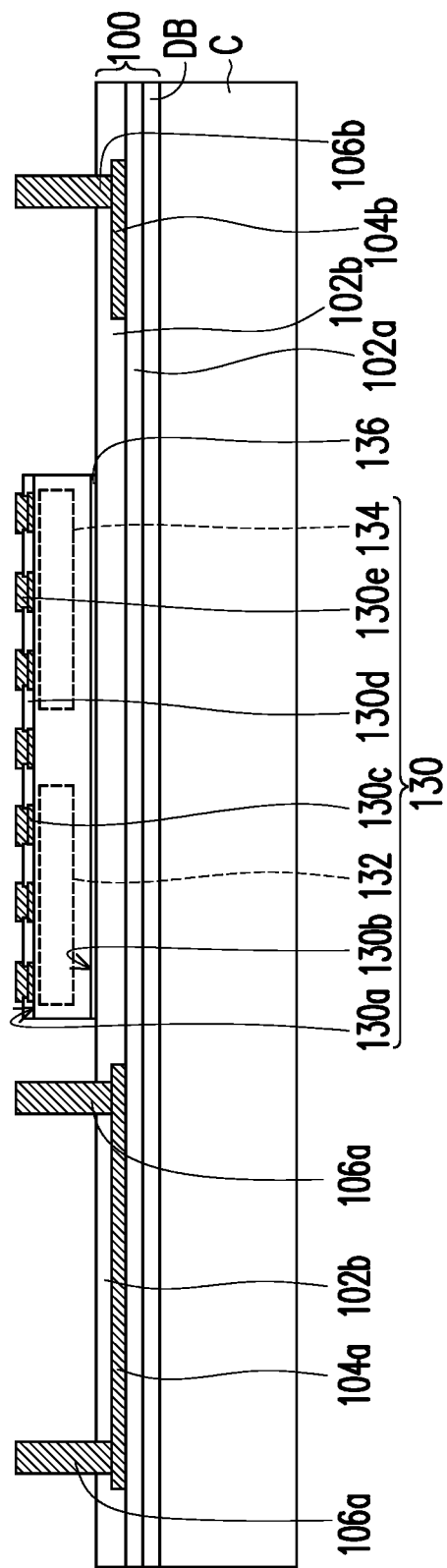

Referring to FIG. 14, a dual band radio frequency die 130 is picked and placed on the top dielectric layer 102b. The dual band radio frequency die 130 includes a first part 132 and a second part 134, wherein the frequency range of the first part 132 of the dual band radio frequency die 130 is different from the frequency range of the second part 134 of the dual band radio frequency die 130. In some embodiments, the frequency range of the first part 132 is smaller than the frequency range of the second part 134. The frequency range of the first part 132 may range from about 5.5 GHz to about 5.8 GHz, and the frequency range of the second part 132 may be about 12.4 GHz. In other words, the first part 132 of the dual band radio frequency die 130 may process a lower-frequency RF signal (e.g., RF signal with lower bandwidth of about 5.5 GHz to about 5.8 GHz), and the second part 134 of the dual band radio frequency die 130 may process a higher-frequency RF signal (e.g. RF signal with higher bandwidth of about 12.4 GHz).

The dual band radio frequency die 130 may include a front surface 130a and a back surface 130b opposite to the front surface 130a. The dual band radio frequency die 130 may further include conductive pads 130c distributed on the front surface 130a, a passivation layer 130d, and conductive pillars 130e. The passivation layer 130d covers the conductive pads 130c and the front surface 130a. The passivation layer 130d includes openings for exposing the conductive pads 130a. The conductive pillars 130e are disposed on the passivation layer 130d and electrically connected to the conductive pads 130c through the openings formed in the passivation layer 130d. In some embodiments, the conductive pillars 130e protrude from the top surface of the passivation layer 130d. Furthermore, the back surface 130b of the dual band radio frequency die 130 may be attached to a die-bond region of the top dielectric layer 102b through a die attach film (DAF) 136, an adhesive or the like.

As illustrated in FIG. 14, the level height of the top surfaces of the conductive pillars 130e is lower than the level height of the top surfaces of the conductive through vias 106a and 106b, and the level height of the top surface of the passivation layer 130d is lower than the level height of the top surfaces of the conductive pillars 130e. However, the arrangement of the passivation layer 130d and the conductive pillars 130e is not limited in the present disclosure. The conductive pillars 130e may be encapsulated by the passivation layer 130d. The conductive pillars 130e may not protrude from the passivation layer 130d. In other words, the level height of the top surface of the passivation layer 130d is lower than the level height of the top surfaces of the conductive through vias 106a and 106b, and the level height of the top surface of the passivation layer 130d is higher than the level height of the top surfaces of the conductive pillars 130e.

Figure 15:
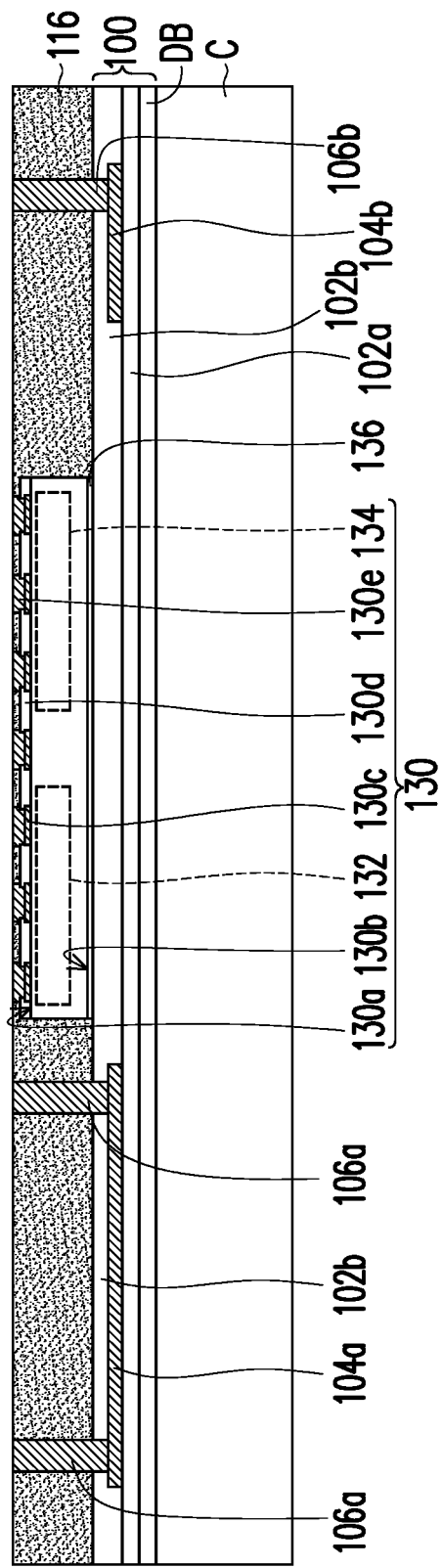

Referring to FIG. 15, an insulating material is formed on the top dielectric layer 102b to cover the dual band radio frequency die 130 and the conductive through vias 106a and 106b. The passivation layer 130d and the conductive pillars 130e may be covered by the insulating material. The insulating material may be in contact with the dual band radio frequency die 130 and the conductive through-vias 106a and 106b directly. The top surface of the insulating material may be higher than the top surfaces of the dual band radio frequency die 130 and the top surfaces of the conductive through-vias 106a and 106b. The insulating material may be a molding compound formed by a molding process. In some embodiments, the insulating material includes epoxy or other suitable dielectric materials.

The insulating material is partially removed until the top surfaces of the conductive pillars 130e and the top surfaces of the conductive through vias 106a and 106b are exposed. In some embodiments, the insulating material is partially removed through a mechanical grinding process and/or a chemical mechanical polishing (CMP) process. After the insulating material is partially removed, an insulating encapsulation 116 is formed over the top dielectric layer 102b to laterally encapsulate the dual band radio frequency die 130 and the conductive through-vias 106a and 106b. During the removal process of the insulating material, portions of the conductive through vias 106a and 106b as well as portions of the conductive pillars 130e are partially removed also.

After forming the insulating encapsulation 116, the top surface of the insulating encapsulation 116 is substantially level with the top surfaces of the conductive through vias 106a and 106b as well as the top surfaces of the conductive pillars 130e. The top surfaces of the conductive through vias 106a, the top surfaces of the conductive through vias 106b and the top surfaces of the conductive pillars 130e are revealed. The insulating encapsulant 116 is in contact with sidewalls of the conductive pillars 130e. As illustrated in FIG. 15, the level height of the top surface of the passivation layer 130d is lower than the level height of the top surface of the insulating encapsulation 116. Furthermore, the top surface of the passivation layer 130d are covered by the insulating encapsulation 116.

In some other embodiments, not illustrated in figures, after forming the insulating encapsulation 116, the top surface of the insulating encapsulation 116 is substantially level with the top surface of the passivation layer 130d, the top surfaces of the conductive through vias 106a, the top surfaces of the conductive through vias 106b and the top surfaces of the conductive pillars 130e. Furthermore, the insulating encapsulant 116 is not in contact with sidewalls of the conductive pillars 130e. In other words, the insulating encapsulant 116 is spaced apart from the conductive pillars 130e by the passivation layer 130d.

Figure 16:
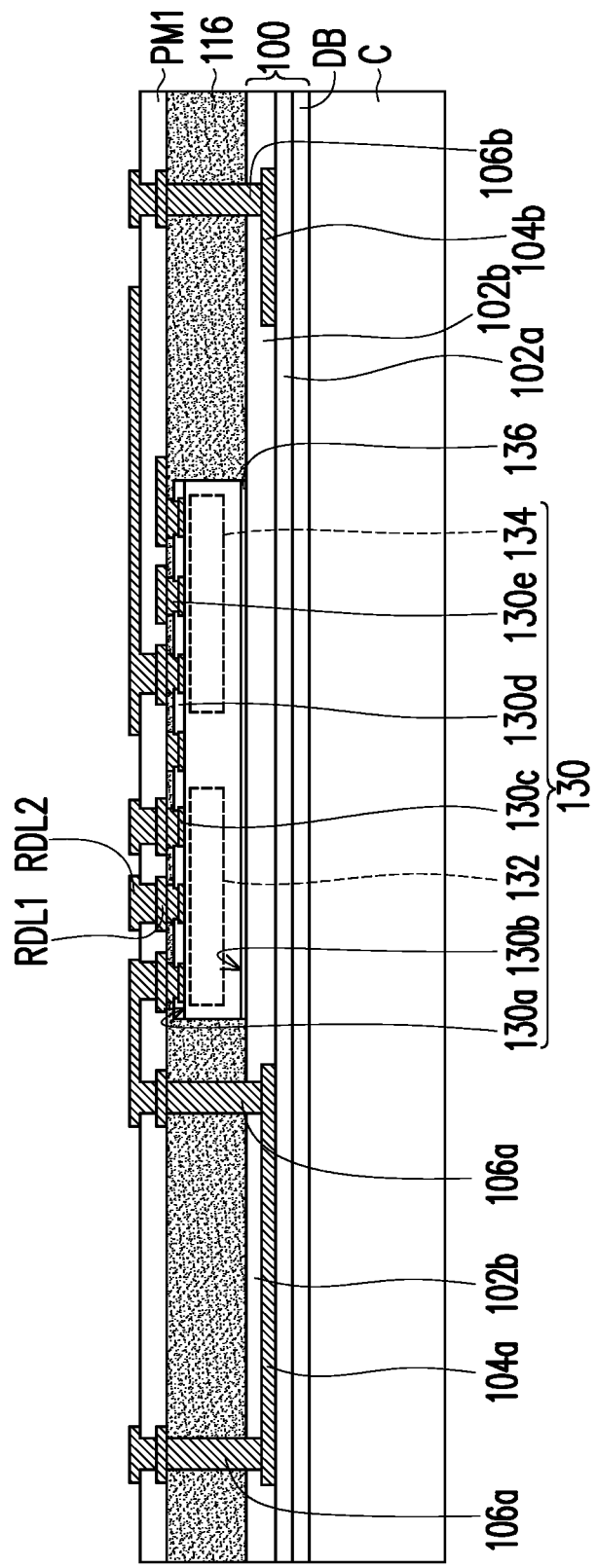
Figure 17:
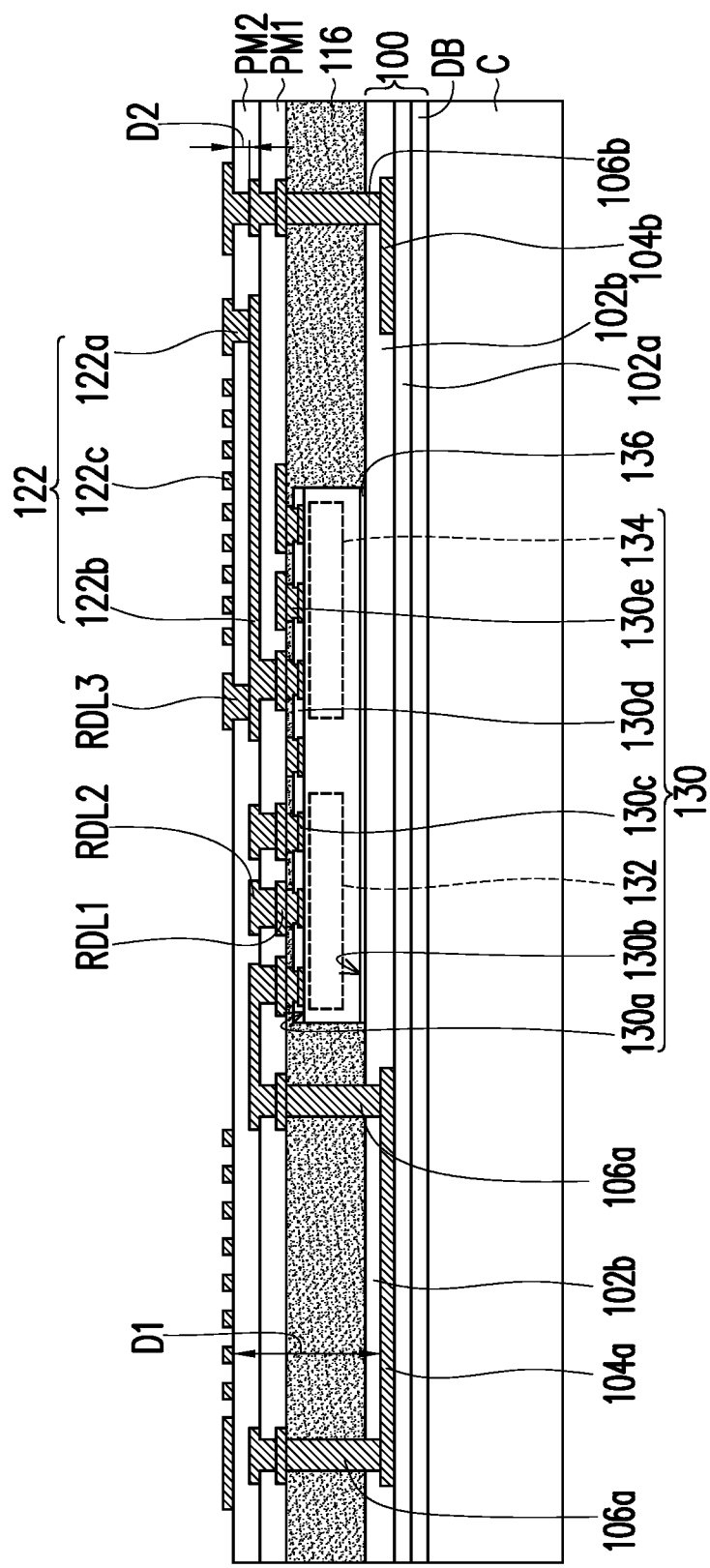
Figure 18:
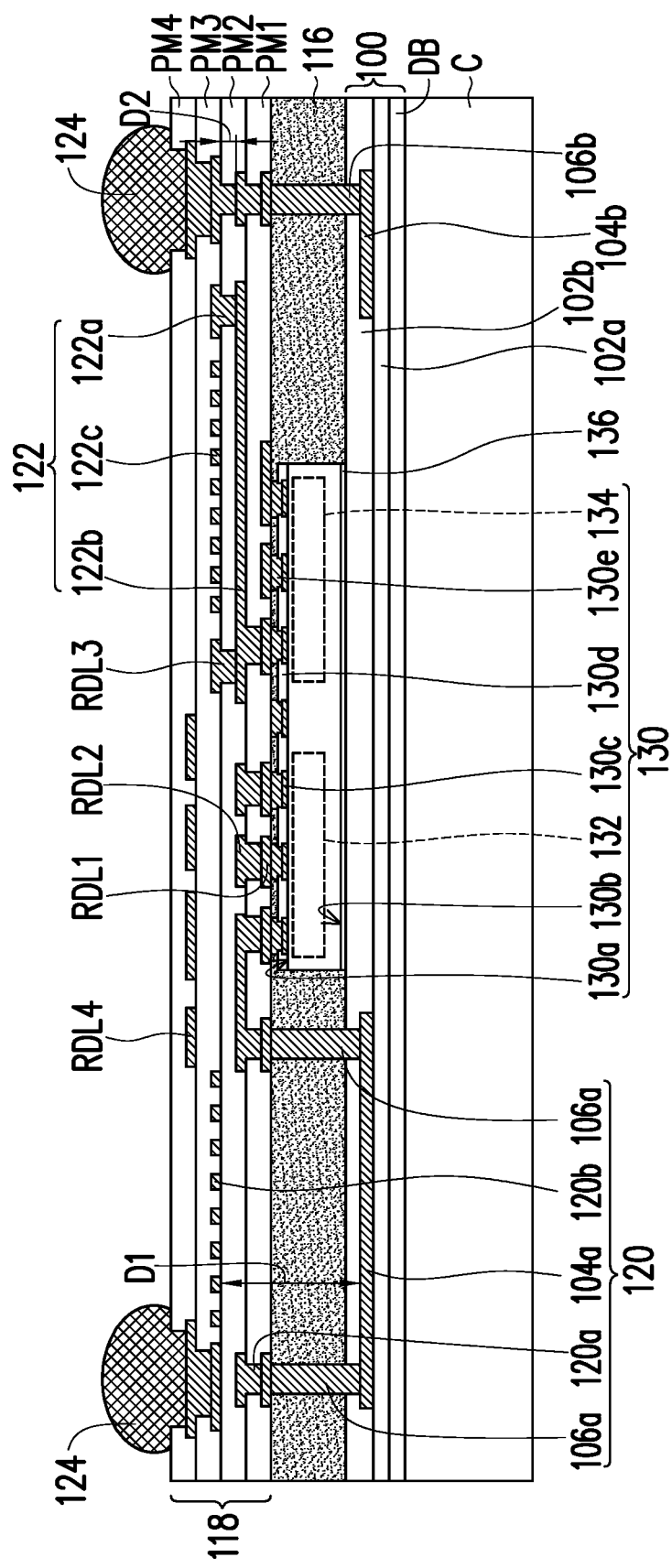

Referring to FIG. 16 through FIG. 18, after forming the insulating encapsulation 116, a front side redistribution circuit structure 118 (shown in FIG. 18) is formed on the top surface of the insulating encapsulation 116. The front side redistribution circuit structure 118 is fabricated to electrically connect with one or more connectors underneath. Here, the afore-said connectors may be or include the conductive pillars 130e of the dual band radio frequency die 130, the conductive through-vias 106a and the conductive through-vias 106b. The fabrication processes of the front side redistribution circuit structure 118 are the same as those illustrated in FIG. 5 through FIG. 7, detailed descriptions regarding to the processes illustrated in FIG. 16 through FIG. 18 are thus omitted.

The first oscillation cavity 120 is embedded in the insulating encapsulant 116, the front side redistribution circuit structure 100 and the back side redistribution circuit structure 118, and the second oscillation cavity 122 is embedded in the back side redistribution circuit structure 118 and located at a side of the insulating encapsulant 116. In some embodiments, the first conductive posts 106a and the first electrode 104a of the first oscillation cavity 120 are electrically connected to the first part 132 of the radio frequency die 130, and the first conductive grids 120b of the first oscillation cavity 120 are electrically grounded. In some embodiments, the second conductive posts 122a and the second electrode 122b of the second oscillation cavity 122 are electrically connected to the second part 134 of the radio frequency die 130, and the second conductive grids 122c of the second oscillation cavity 122 are electrically grounded.

Figure 19:
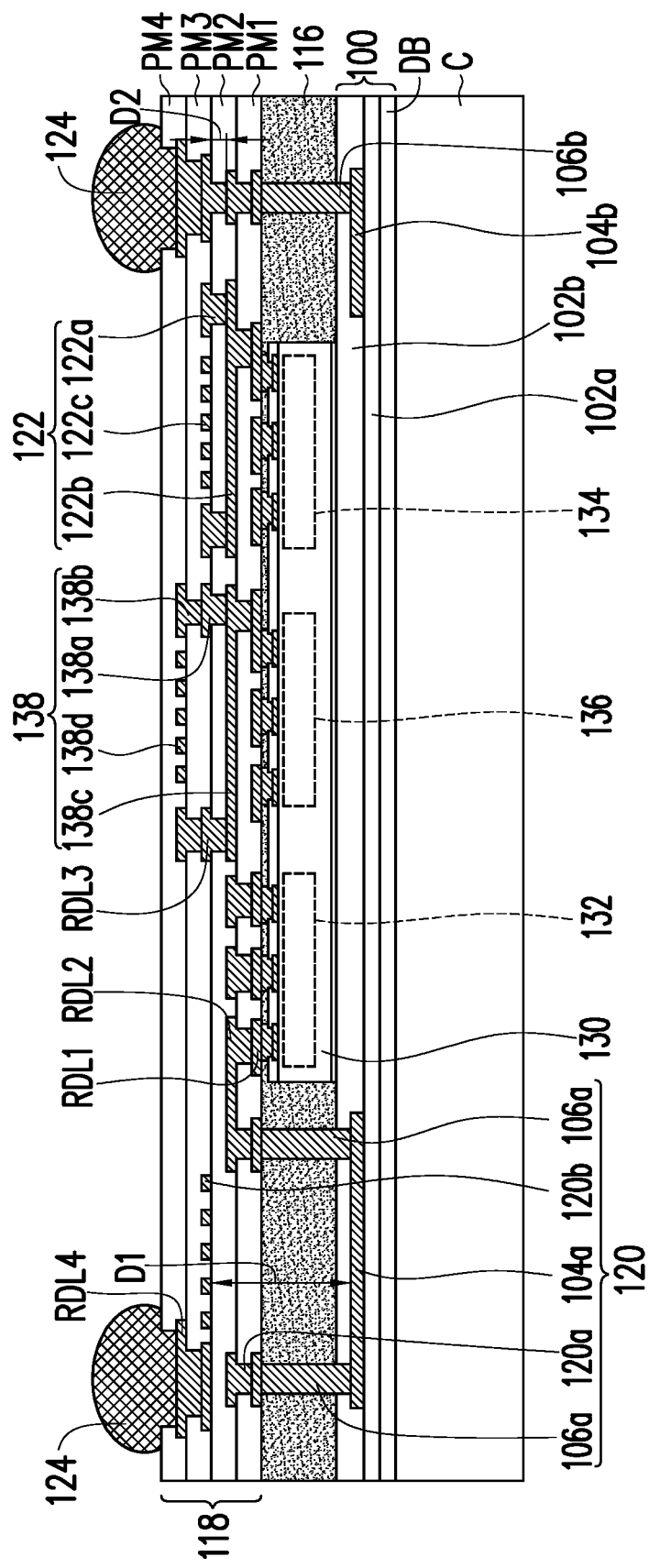
FIG. 19, FIG. 20 and FIG. 21 are cross-sectional views schematically illustrating package structures in accordance with yet another embodiment of the present disclosure.
Figure 20:
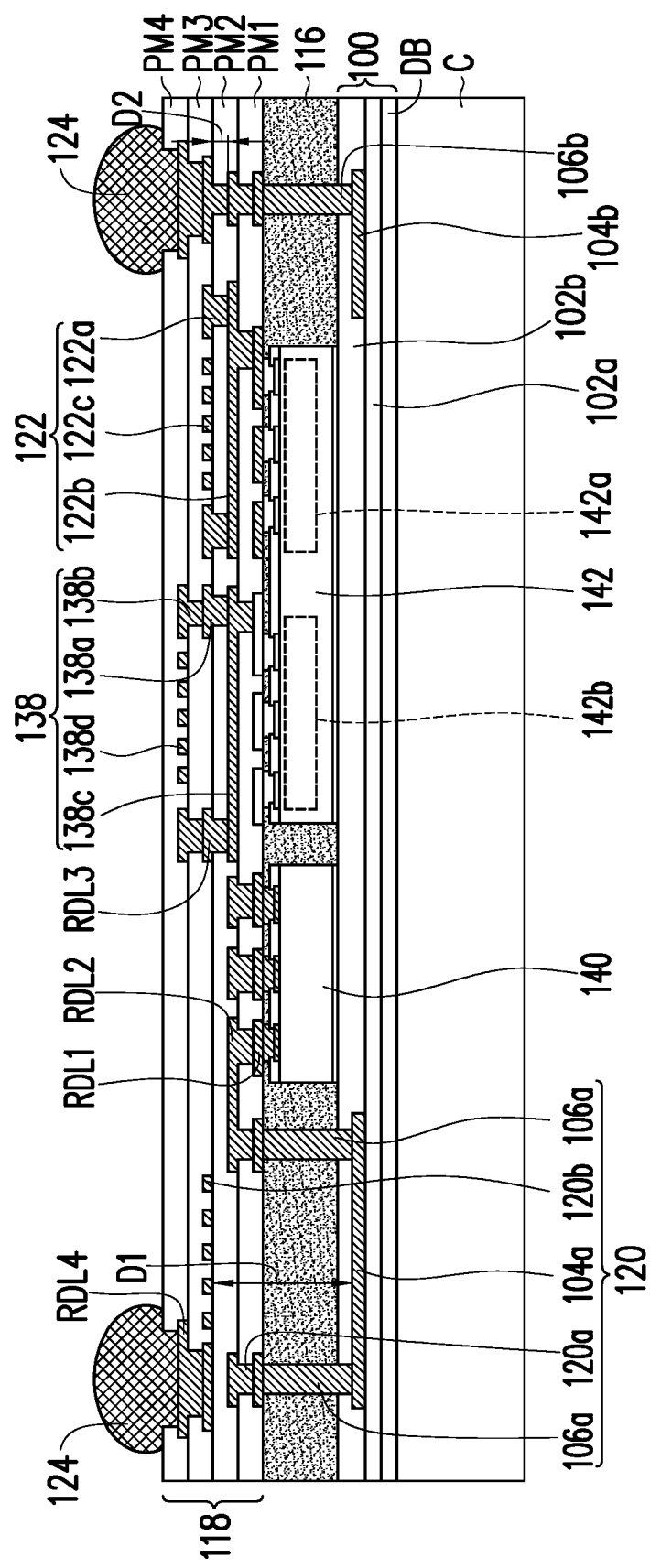
Figure 21:
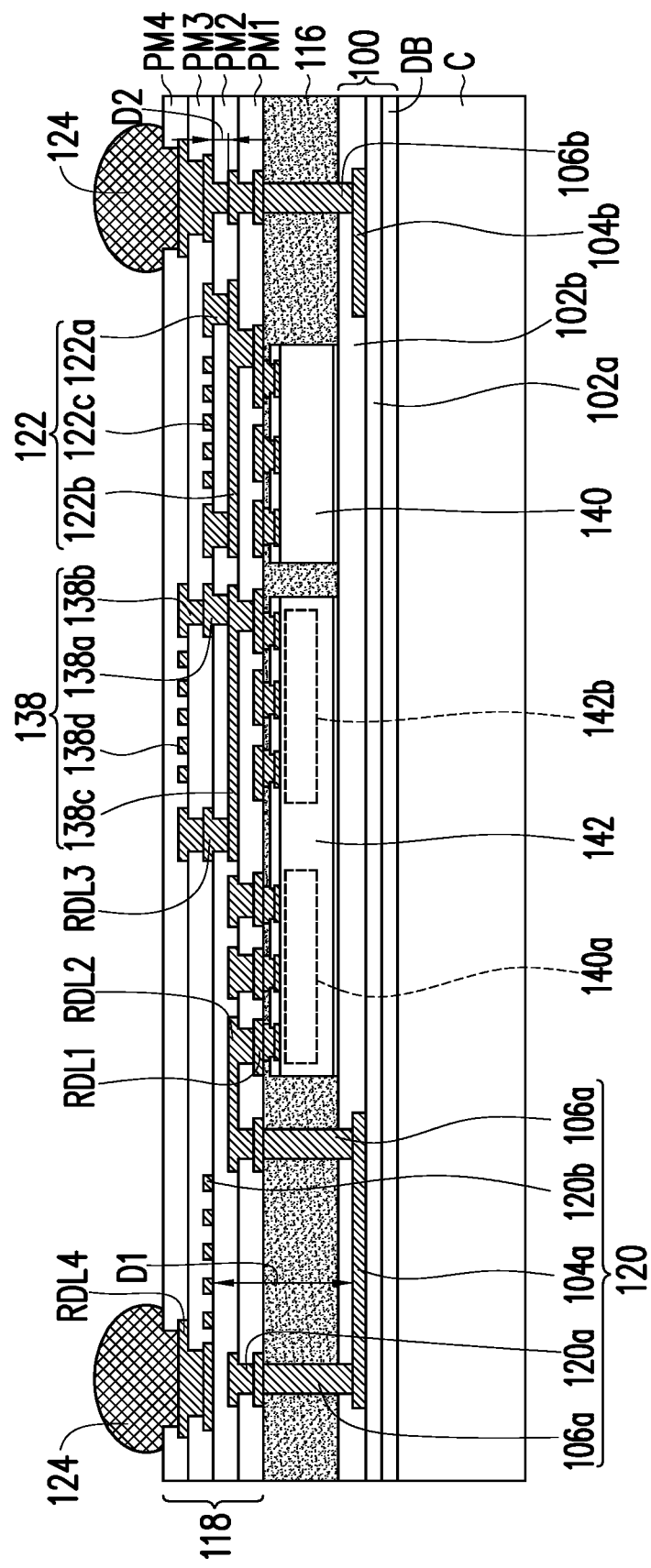

FIG. 19, FIG. 20 and FIG. 21 are cross-sectional views schematically illustrating package structures in accordance with yet another embodiment of the present disclosure.

Referring to FIG. 18 and FIG. 19, the package structure illustrated in FIG. 19 is similar to the package structure illustrated in FIG. 18 except that the package structure illustrated in FIG. 19 further includes a third oscillation cavity 138, wherein the radio frequency die 130 further includes a third part 136, wherein the frequency range of the third part 136 is different from the frequency range of the first part 132 and the frequency range of the second part 134, and the third oscillation cavity 138 is electrically connected to the third part 136 of the radio frequency die 130. The package structure illustrated in FIG. 10 is a triple band module capable of processing triple band RF signal. As illustrated in FIG. 19, the third oscillation cavity 138 may include a patch antenna, and the patch antenna may include third conductive posts 138a and 138b, a third electrode 138c and third conductive grids 138d, wherein the third conductive posts 138a, 138b and the third electrode 138c are electrically connected to the third part 136 of the radio frequency die 130 through the redistribution wirings RDL1, the third electrode 138c and the third conductive grids 138d are disposed at the same side (e.g., an upper side) of the insulating encapsulant 116, and the third conductive grids 138d are electrically grounded. The third conductive posts 138a are conductive portions of the redistribution wirings RDL3. The third conductive posts 138b and the third conductive grids 138d are different conductive portions of the redistribution wirings RDL4. The third electrode 138c is a conductive portion of the redistribution wirings RDL2.

Referring to FIG. 19 and FIG. 20, the package structure illustrated in FIG. 20 is similar to the package structure illustrated in FIG. 19 except that the package structure illustrated in FIG. 20 includes a single band radio frequency die 140 and a dual band radio frequency die 142. The single band radio frequency die 140 is electrically connected to the first oscillation cavity 120. The dual band radio frequency die 142 includes a first part 142a and a second part 142b, wherein the frequency range of the first part 142a of the dual band radio frequency die 142 is different from the frequency range of the second part 142b of the dual band radio frequency die 142. The first part 142a of the dual band radio frequency die 142 is electrically connected to the second oscillation cavity 122, and the second part 142b of the dual band radio frequency die 142 is electrically connected to the third oscillation cavity 138. Furthermore, the frequency range of the single band radio frequency die 140 is different from the frequency range of the first part 142a of the dual band radio frequency die 142 and the frequency range of the second part 142b of the dual band radio frequency die 142.

Referring FIG. 19 to FIG. 21, the package structure illustrated in FIG. 21 is similar to the package structure illustrated in FIG. 19 except that the package structure illustrated in FIG. 20 includes a single band radio frequency die 140 and a dual band radio frequency die 142. The single band radio frequency die 140 is electrically connected to the second oscillation cavity 122. The dual band radio frequency die 142 includes a first part 142a and a second part 142b, wherein the frequency range of the first part 142a of the dual band radio frequency die 142 is different from the frequency range of the second part 142b of the dual band radio frequency die 142. The first part 142a of the dual band radio frequency die 142 is electrically connected to the first oscillation cavity 120, and the second part 142b of the dual band radio frequency die 142 is electrically connected to the third oscillation cavity 138. Furthermore, the frequency range of the single band radio frequency die 140 is different from the frequency range of the first part 142a of the dual band radio frequency die 142 and the frequency range of the second part 142b of the dual band radio frequency die 142.

In the above-mentioned embodiments, the number of the first oscillation cavity 120, the second oscillation cavity 122, the third oscillation cavity 128 and the third oscillation cavity 138 is not limited. In other words, two or more oscillation cavities may be electrically connected to a single band RF die or each part of a multi-band RF die such that transmission performance of the package structures can be enhanced.

In the above-mentioned embodiments, the fabrication of the first oscillation cavity 120, the second oscillation cavity 122, the third oscillation cavity 128 is compatible with fabrication processes of the package structures. Accordingly, it is easy to integrate the first oscillation cavity 120, the second oscillation cavity 122, the third oscillation cavity 128 into compact size package structures.

In accordance with some embodiments of the disclosure, a package structure including a first radio frequency die, a second radio frequency die, an insulating encapsulant, a redistribution circuit structure, a first oscillation cavity and a second oscillation cavity is provided. A first frequency range of the first radio frequency die is different from a second frequency range of the second radio frequency die. The insulating encapsulant laterally encapsulates the first radio frequency die and the second radio frequency die. The redistribution circuit structure is disposed on the first radio frequency die, the second die and the insulating encapsulant. The first oscillation cavity is electrically connected to the first radio frequency die, and the second oscillation cavity is electrically connected to the second radio frequency die. In some embodiments, the first oscillation cavity is embedded in the insulating encapsulant and the redistribution circuit structure, and the second oscillation cavity is embedded in the redistribution circuit structure and located at a side of the insulating encapsulant. In some embodiments, the first oscillation cavity includes a patch antenna, and the patch antenna includes first conductive posts embedded in the insulating encapsulant, a first electrode and first conductive grids, wherein the first electrode and the first conductive grids are disposed at opposite sides of the insulating encapsulant, the first conductive posts and the first electrode are electrically connected to the first radio frequency die, and the first conductive grids are electrically grounded. In some embodiments, the second oscillation cavity includes a patch antenna, and the patch antenna includes second conductive posts electrically connected to the second radio frequency die, a second electrode electrically connected to the second radio frequency die and second conductive grids, wherein the second electrode and the second conductive grids are disposed at a same side of the insulating encapsulant, and the second conductive grids are electrically grounded. In some embodiments, the first electrode is located at a first level height, the second electrode is located at a second level height higher than the first level height, and the first conductive grids and the second conductive grids are located at a third level height higher than the second level height. In some embodiments, the second oscillation cavity is stacked over the second radio frequency die. In some embodiments, the package structure further includes a third radio frequency die and a third oscillation cavity, wherein a third frequency range of the third radio frequency die is different from the first frequency range of the first radio frequency die and the second frequency range of the second radio frequency die, and the third oscillation cavity is electrically connected to the third radio frequency die.

In accordance with some other embodiments of the disclosure, a package structure including a radio frequency die, an insulating encapsulant, a redistribution circuit structure, a first oscillation cavity and a second oscillation cavity is provided. The insulating encapsulant laterally encapsulates the radio frequency die. The redistribution circuit structure is disposed on the radio frequency die and the insulating encapsulant. The first oscillation cavity is electrically connected to a first part of the radio frequency die. The second oscillation cavity is electrically connected to a second part of the radio frequency die, and a first frequency range of the first part of the radio frequency die is different from a second frequency range of the second part of the radio frequency die. In some embodiments, the first oscillation cavity is embedded in the insulating encapsulant and the redistribution circuit structure, and the second oscillation cavity is embedded in the redistribution circuit structure and located at a side of the insulating encapsulant. In some embodiments, the first oscillation cavity includes a patch antenna, and the patch antenna includes first conductive posts embedded in the insulating encapsulant, a first electrode and first conductive grids, wherein the first electrode and the first conductive grids are disposed at opposite sides of the insulating encapsulant, the first conductive posts and the first electrode are electrically connected to the first part of the radio frequency die, and the first conductive grids are electrically grounded. In some embodiments, the second oscillation cavity includes a patch antenna, and the patch antenna includes second conductive posts electrically connected to the second part of the radio frequency die, a second electrode electrically connected to the second part of the radio frequency die and second conductive grids, wherein the second electrode and the second conductive grids are disposed at a same side of the insulating encapsulant, and the second conductive grids are electrically grounded. In some embodiments, the first electrode is located at a first level height, the second electrode is located at a second level height higher than the first level height, and the first conductive grids and the second conductive grids are located at a third level height higher than the second level height. In some embodiments, the second oscillation cavity is stacked over the radio frequency die. In some embodiments, the package structure further includes a third oscillation cavity, wherein the radio frequency die further includes a third part, a third frequency range of the third part is different from the first frequency range of the first part and the second frequency range of the second part, and the third oscillation cavity is electrically connected to the third part of the radio frequency die.

In accordance with some other embodiments of the disclosure, a package structure including at least one radio frequency die, an insulating encapsulant, a first redistribution circuit structure, a second redistribution circuit structure, a first antenna and a second antenna is provided. The insulating encapsulant laterally encapsulates the at least one radio frequency die. The at least one radio frequency die and the insulating encapsulant are sandwiched between the first redistribution circuit structure and the second redistribution circuit structure. The first antenna includes a first electrode, first conductive posts and first conductive grids, wherein the first electrode is embedded in the first redistribution circuit structure and electrically connected to the at least one radio frequency die, the first conductive posts penetrate through the insulating encapsulant and are electrically connected to the first electrode, and the first conductive grids are embedded in the second redistribution circuit structure and electrically grounded. The second antenna includes a second electrode, second conductive posts and second conductive grids, wherein the second electrode and the second conductive posts are electrically connected to the at least one radio frequency die, and the second conductive grids are embedded in the second redistribution circuit structure and electrically grounded. In some embodiments, a first level height difference between the first electrode and the first conductive grids is greater than a second level height difference between the second electrode and the second conductive grids. In some embodiments, the first conductive grids and the second conductive grids are located at a same level height. In some embodiments, the first electrode is spaced apart from the first conductive grids by the insulating encapsulant, at least one dielectric layer of the first redistribution circuit structure and at least one dielectric layer of the second redistribution circuit structure. In some embodiments, the second electrode is spaced apart from the second conductive grids by at least one dielectric layer of the second redistribution circuit structure. In some embodiments, the second antenna is stacked over the at least one radio frequency die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a first radio frequency die;
   a second radio frequency die, wherein a first frequency range of the first radio frequency die being different from a second frequency range of the second radio frequency die;
   an insulating encapsulant laterally encapsulating the first radio frequency die and the second radio frequency die;
   a redistribution circuit structure disposed on the first radio frequency die, the second die and the insulating encapsulant;
   a first oscillation cavity electrically connected to the first radio frequency die, wherein the first oscillation cavity comprises:
   first conductive posts embedded in the insulating encapsulant;
   a first electrode;
   first conductive grids, wherein the first electrode and the first conductive grids are disposed at opposite sides of the insulating encapsulant, the first conductive posts and the first electrode are electrically connected to the first radio frequency die, and the first conductive grids are electrically grounded; and
   a second oscillation cavity electrically connected to the second radio frequency die.

2. The package structure of claim 1, wherein the first oscillation cavity is embedded in the insulating encapsulant and the redistribution circuit structure, and the second oscillation cavity is embedded in the redistribution circuit structure and located at a side of the insulating encapsulant.

3. The package structure of claim 1, wherein the first oscillation cavity comprises a patch antenna.

4. The package structure of claim 1, wherein the second oscillation cavity comprises a patch antenna, and the patch antenna comprises:
   second conductive posts electrically connected to the second radio frequency die;
   a second electrode electrically connected to the second radio frequency die; and
   second conductive grids, wherein the second electrode and the second conductive grids are disposed at a same side of the insulating encapsulant, and the second conductive grids are electrically grounded.

5. The package structure of claim 4, wherein the first electrode is located at a first level height, the second electrode is located at a second level height higher than the first level height, and the first conductive grids and the second conductive grids are located at a third level height higher than the second level height.

6. The package structure of claim 1, wherein the second oscillation cavity is stacked over the second radio frequency die.

7. The package structure of claim 1 further comprising:
   a third radio frequency die, wherein a third frequency range of the third radio frequency die is different from the first frequency range of the first radio frequency die and the second frequency range of the second radio frequency die; and
   a third oscillation cavity electrically connected to the third radio frequency die.

8. A package structure, comprising:
   a radio frequency die;
   an insulating encapsulant laterally encapsulating the radio frequency die;
   a redistribution circuit structure disposed on the radio frequency die and the insulating encapsulant;

a first oscillation cavity electrically connected to a first part of the radio frequency die, wherein the first oscillation cavity comprises:
  first conductive posts embedded in the insulating encapsulant;
  a first electrode;
  first conductive grids, wherein the first electrode and the first conductive grids are disposed at opposite sides of the insulating encapsulant, the first conductive posts and the first electrode are electrically connected to the first radio frequency die, and the first conductive grids are electrically grounded; and
a second oscillation cavity electrically connected to a second part of the radio frequency die, wherein a first frequency range of the first part of the radio frequency die is different from a second frequency range of the second part of the radio frequency die.

9. The package structure of claim 8, wherein the first oscillation cavity is embedded in the insulating encapsulant and the redistribution circuit structure, and the second oscillation cavity is embedded in the redistribution circuit structure and located at a side of the insulating encapsulant.

10. The package structure of claim 8, wherein the first oscillation cavity comprises a patch antenna.

11. The package structure of claim 8, wherein the second oscillation cavity comprises a patch antenna, and the patch antenna comprises:
  second conductive posts electrically connected to the second radio frequency die;
  a second electrode electrically connected to the second radio frequency die; and
  second conductive grids, wherein the second electrode and the second conductive grids are disposed at a same side of the insulating encapsulant, and the second conductive grids are electrically grounded.

12. The package structure of claim 11, wherein the first electrode is located at a first level height, the second electrode is located at a second level height higher than the first level height, and the first conductive grids and the second conductive grids are located at a third level height higher than the second level height.

13. The package structure of claim 8, wherein the second oscillation cavity is stacked over the radio frequency die.

14. The package structure of claim 8 further comprising:
  a third oscillation cavity, wherein the radio frequency die further comprises a third part, a third frequency range of the third part is different from the first frequency range of the first part and the second frequency range of the second part, and the third oscillation cavity is electrically connected to the third part of the radio frequency die.

15. A package structure, comprising:
  at least one radio frequency die;
  an insulating encapsulant laterally encapsulating the at least one radio frequency die;
  a first redistribution circuit structure; and
  a second redistribution circuit structure, wherein the at least one radio frequency die and the insulating encapsulant being sandwiched between the first redistribution circuit structure and the second redistribution circuit structure,
  a first antenna, comprising:
    a first electrode embedded in the first redistribution circuit structure and electrically connected to the at least one radio frequency die;
    first conductive posts penetrating through the insulating encapsulant and electrically connected to the first electrode;
    first conductive grids embedded in the second redistribution circuit structure and electrically grounded;
  a second antenna, comprising:
    a second electrode;
    second conductive posts, wherein the second electrode and the second conductive posts are electrically connected to the at least one radio frequency die; and
    second conductive grids embedded in the second redistribution circuit structure and electrically grounded.

16. The package structure of claim 15, wherein a first level height difference between the first electrode and the first conductive grids is greater than a second level height difference between the second electrode and the second conductive grids.

17. The package structure of claim 15, wherein the first conductive grids and the second conductive grids are located at a same level height.

18. The package structure of claim 15, wherein the first electrode is spaced apart from the first conductive grids by the insulating encapsulant, at least one dielectric layer of the first redistribution circuit structure and at least one dielectric layer of the second redistribution circuit structure.

19. The package structure of claim 15, wherein the second electrode is spaced apart from the second conductive grids by at least one dielectric layer of the second redistribution circuit structure.

20. The package structure of claim 15, wherein the second antenna is stacked over the at least one radio frequency die.

* * * * *